(12) United States Patent
Sumita

(10) Patent No.: US 7,417,467 B2
(45) Date of Patent: Aug. 26, 2008

(54) SEMICONDUCTOR INTEGRATED CIRCUIT

(75) Inventor: Masaya Sumita, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/898,700

(22) Filed: Sep. 14, 2007

(65) Prior Publication Data

US 2008/0012601 A1    Jan. 17, 2008

Related U.S. Application Data

(62) Division of application No. 11/188,740, filed on Jul. 26, 2005, now Pat. No. 7,282,957.

(30) Foreign Application Priority Data

Jul. 27, 2004    (JP) .............................. 2004-218244

(51) Int. Cl.
    *H03K 19/094* (2006.01)

(52) U.S. Cl. ........................................ 326/105; 326/95

(58) Field of Classification Search ......... 326/105–108, 326/95–98
    See application file for complete search history.

(56) References Cited

U.S. PATENT DOCUMENTS

| 6,549,038 | B1 | 4/2003 | Sechen et al. |
| 6,593,777 | B2 * | 7/2003 | Alofs ......................... 326/105 |
| 6,750,677 | B2 | 6/2004 | Sumita |
| 6,791,363 | B1 | 9/2004 | Amatangelo et al. |
| 6,879,186 | B2 | 4/2005 | Liu |
| 6,914,450 | B2 * | 7/2005 | Chu et al. ..................... 326/46 |

FOREIGN PATENT DOCUMENTS

JP    2003-60497 A    2/2003

* cited by examiner

*Primary Examiner*—James H Cho
(74) *Attorney, Agent, or Firm*—McDermott Will & Emery LLP

(57) ABSTRACT

In a dynamic flip-flop circuit with a data selection function, for example, when data having an H value is selected using a selection signal, a first node N1 is L, a second node N2 of a second dynamic circuit is H, so that an output signal has an H level. In this case, when none of a plurality of pieces of data is selected using a selection signal, the first node N1 is H, so that the electric charge of the second node N2 is discharged and the output signal erroneously has an L level. However, in this case, an output node N3 is H and a fourth node N4 is L, so that an n-type transistor of the second dynamic circuit is turned OFF, thereby preventing the second node N2 from being discharged. Therefore, a normal operation is performed while securing a satisfactorily high-speed operation even when none of the pieces of data is selected.

1 Claim, 21 Drawing Sheets

US 7,417,467 B2

SEMICONDUCTOR INTEGRATED CIRCUIT

CROSS REFERENCE TO RELATED APPLICATIONS

This application is a Divisional of U.S. application Ser. No. 11/188,740, filed Jul. 26, 2005, now U.S. Pat. No. 7,282,957 claiming priority of Japanese Application No. 2004-218244, filed Jul. 27, 2004, the entire contents of each of which are hereby incorporated by reference.

BACKGROUND OF THE INVENTION

The present invention relates to a semiconductor integrated circuit, and more particularly, to a high-speed semiconductor integrated circuit.

Conventionally, the speed of a semiconductor integrated circuit, particularly a flip-flop circuit, is increased by incorporating a dynamic circuit into its internal structure as described in, for example, JP No. 2003-060497 A. The dynamic flip-flop circuit described in this publication receives a plurality of pieces of data, selects any one of them, and holds and outputs the selected data.

Hereinafter, the structure of the flip-flop circuit having the data selection function will be described with reference to FIG. 3A. In FIG. 3A, a data selection circuit 91 is provided at the previous stage of a holding circuit 90. In the data selection circuit 91, when a clock CLK is at a Low level (Low period), a node N1 is precharged to a power source potential Vdd by a p-type transistor Tr1, while a node N2 is precharged to the power source potential Vdd by a p-type transistor Tr50. Near the end of this period, one of selection signals S0 to S2 which is used to select a corresponding one of a plurality of pieces of data D0 to D2 is turned High. Subsequently, when the clock CLK goes to High and the selected data (e.g., D0) is at a High level, the electric charge of the node N1 is discharged via an n-type transistor Tr2, so that the potential of the node N1 becomes equal to that of the ground. Therefore, an n-type transistor Tr51 is turned OFF, so that the precharge potential of the node N2 is held. In this case, this potential is held as an H value by the holding circuit 90, which in turn outputs an output signal Q indicating the H value.

On the other hand, when the selected data D0 is at a Low level, the electric charge of the node N1 is not discharged, so that the potential of the node N1 is held as it is the precharge potential and the n-type transistor Tr51 is turned ON. As a result, the electric charge of the node N2 is discharged via the n-type transistor Tr51 and the n-type transistor Tr2, so that the potential of the node N2 becomes an L value. The L value is held by the holding circuit 90, which in turn outputs an output signal Q indicating the L value.

Note that, in FIG. 3A, SI indicates a data input when scanning is performed, SE indicates a scan shift control signal, and SEB indicates an inverted signal of the scan shift control signal.

However, it was found that the conventional dynamic flip-flop circuit having the data selection function malfunctions when none of the plurality of pieces of data is selected. Hereinafter, the malfunction will be described.

In an ordinary operation, for example, the node N2 is at the precharge potential (H value) and the holding circuit 90 outputs the output signal Q indicating the H value. In this case, when none of the plurality of pieces of data D0 to D2 is selected during the next High period of the clock CLK (i.e., all the selection signals S0 to S2 have the Low value), the n-type transistor Tr2 is turned ON. However, the precharge potential of the node N1 is held, so that the n-type transistor Tr51 is turned ON. Therefore, the electric charge of the node N2 is discharged via the n-type transistors Tr51 and Tr2 to the L value. As a result, the holding circuit 90 erroneously outputs an output signal Q indicating the L value.

To solve the above-described problems, for example, the following circuit is considered which inputs a signal to the gate of the n-type transistor Tr2 as shown in FIG. 3B. Specifically, a static circuit comprising a circuit 92 including an OR circuit which receives all the selection signals S0 to S2 and a latch circuit which latches an output of the OR circuit during a High period of the clock CLK, and an AND circuit 93 which receives an output of the latch circuit and the clock CLK, is additionally provided, and an output of the AND circuit 93 is input to the gate of the n-type transistor Tr2.

In this case, however, all the selection signals S0 to S2 need to be passed through the OR circuit and the latch circuit by a rising time of the clock CLK. Therefore, an extra setup time (a time required for the static circuit to establish its output by a rising time of the clock CLK) is required, resulting in impairment of the speed of operation.

SUMMARY OF THE INVENTION

An object of the present invention is to provide a dynamic flip-flop circuit with a data selection function which can operate normally while securing a satisfactorily high-speed operation even when none of a plurality of pieces of data is selected.

To achieve the object, according to the present invention, when none of a plurality of pieces of data is selected, for example, the precharge of the node N2 is prevented from being discharged of FIG. 3A, so that the H value of the node N2 is maintained. The holding circuit holds and outputs the H value of the node N2.

A semiconductor integrated circuit of the present invention receives a clock, a plurality of pieces of data, and a plurality of selection signal for selecting the data, and when the clock is transitioned, outputs a selected one of the pieces of data selected by the selection signal to a holding circuit. The semiconductor integrated circuit comprises a non-selected state detection circuit of detecting that all of the plurality of selection signals selects none of the plurality of pieces of data. In the non-selected state detection circuit, when it is detected that all of the plurality of selection signals selects none of the plurality of pieces of data, the previously selected data is prevented from being changed, thereby holding output data of the holding circuit.

Another semiconductor integrated circuit of the present invention comprises a NOR type first dynamic circuit of receiving a first clock and a plurality of pieces of data, wherein a first output node is charged during a first period which is one of a period from rising to falling of the first clock and a period of falling to rising of the first clock, and during a second period which is the other period, electric charge of the first output node is held when all of the plurality of pieces of data have the same value, while the electric charge of the first output node is discharged when at least one of the plurality of pieces of data has a different value from the other pieces of data, a NAND type second dynamic circuit of receiving a second clock and a signal of the first output node of the first dynamic circuit, wherein, during a first period or a second period of the second clock, electric charge of the second output node is held when the electric charge of the first output node of the first dynamic circuit is discharged, while the electric charge of the second output node is discharged when the electric charge of the first output node is held, a NOR type third dynamic circuit of receiving a third clock and a plurality of selection signals for selecting the respective pieces of data, wherein a third output node is charged during a first period of the third clock, and during a second period of the third clock, electric charge of the third output node is held when all of the plurality of selection signals selects none of the plurality of pieces of data, and a NAND type fourth dynamic circuit of receiving a fourth clock and a signal of the third output node of the third dynamic circuit, wherein, during a first period or a second period of the fourth clock, electric charge of the fourth output node is discharged when the electric charge of the third output node of the third dynamic circuit is held. When the second dynamic circuit receives a signal of the fourth output node of the fourth dynamic circuit and the electric charge of the fourth output node is discharged, the second dynamic circuit holds the electric charge of the second output node even when the electric charge of the first output node of the first dynamic circuit is held.

In an example of the semiconductor integrated circuit of the present invention, the NOR type third dynamic circuit and the NAND type fourth dynamic circuit are physically arranged closer to the NAND type second dynamic circuit than to the NOR type first dynamic circuit.

In an example of the semiconductor integrated circuit of the present invention, the NOR type third dynamic circuit and the NAND type fourth dynamic circuit operate with higher speed than that of the NOR type first dynamic circuit.

In an example of the semiconductor integrated circuit of the present invention, the NOR type third dynamic circuit and the NAND type fourth dynamic circuit have a higher supply voltage than that of the NOR type first dynamic circuit.

In an example of the semiconductor integrated circuit of the present invention, the NOR type third dynamic circuit and the NAND type fourth dynamic circuit are physically arranged at a larger distance from an isolation region formed on a semiconductor substrate than from the NOR type first dynamic circuit.

In an example of the semiconductor integrated circuit of the present invention, the semiconductor integrated circuit further comprises an output circuit of receiving the selected data and outputting the selected data. The output circuit comprises a NOR circuit of receiving an output of the NOR type first dynamic circuit and an inverted output of the NAND type second dynamic circuit, a first n-type transistor of receiving the output of the NOR circuit through a gate thereof, and a first p-type transistor of receiving an output of the NAND type second dynamic circuit through a gate thereof. A drain of the first n-type transistor and a drain of the first p-type transistor are connected to each other.

In an example of the semiconductor integrated circuit of the present invention, the output circuit further comprises a second n-type transistor of receiving an output of the NAND type fourth dynamic circuit through a gate thereof. A drain of the second n-type transistor is connected to a source of the first n-type transistor.

In an example of the semiconductor integrated circuit of the present invention, the holding circuit of holding the selected data is connected to the drain of the first n-type transistor and the drain of the first p-type transistor which are two output terminals of the output circuit.

In an example of the semiconductor integrated circuit of the present invention, the holding circuit comprises a first inverter circuit to whose input side the drain of the first p-type transistor of the output circuit is connected, a second inverter circuit of receiving an output of the first inverter circuit, wherein the first n-type transistor and the first p-type transistor are connected in series, and a second n-type transistor of receiving an output of the NAND type second dynamic circuit. The second n-type transistor is disposed between the n-type transistor and the p-type transistor of the second inverter circuit or between the n-type transistor of the second inverter circuit and the ground.

In an example of the semiconductor integrated circuit of the present invention, the semiconductor integrated circuit further comprises an output circuit of receiving the selected data and outputting the selected data. The output circuit comprises a differential circuit having a differential input terminal composed of two input terminals and a differential output terminal, and an OR circuit of receiving an output of the NOR type first dynamic circuit and an inverted output of the NAND type second dynamic circuit. An output of the OR circuit is input to one of the input terminals of the differential input terminal of the differential circuit. An output of the NAND type second dynamic circuit is input to the other of the input terminals of the differential input terminal of the differential circuit.

In an example of the semiconductor integrated circuit of the present invention, the differential circuit comprises a control transistor which allows the differential circuit to perform a differential amplification operation. The control transistor includes an n-type transistor, wherein a drain of the n-type transistor is connected to a source of the differential circuit, a source of the n-type transistor is connected to the ground, and the n-type transistor receives a control signal through a gate thereof.

In an example of the semiconductor integrated circuit of the present invention, resistors are connected in parallel to the control transistor.

In an example of the semiconductor integrated circuit of the present invention, the semiconductor integrated circuit further comprises a signal generation circuit of generating a control signal which is supplied to the gate of the control transistor. The signal generation circuit comprises a short pulse generation circuit of generating a short pulse from a clock signal, and a NAND circuit of receiving the short pulse and an output of the NAND type fourth dynamic circuit. An output of the NAND circuit is supplied as the control signal to the gate of the control transistor.

In an example of the semiconductor integrated circuit of the present invention, transistors included in the NOR type third dynamic circuit and the NAND type fourth dynamic circuit have a threshold voltage lower than that of a transistor included in the NOR type first dynamic circuit.

In an example of the semiconductor integrated circuit of the present invention, the first, second, third and fourth clock signals are the same clock signal.

Another semiconductor integrated circuit of the present invention receives a clock, data, and previous output data of a holding circuit, and when the clock is transitioned, outputting the data while holding the data in the holding circuit. The semiconductor integrated circuit comprises a matching detection circuit of detecting a match between the data and the previous data of the holding circuit. When the matching detection circuit has detected the match between the data and the previous data of the holding circuit, at least a portion of the holding circuit is stopped.

Another semiconductor integrated circuit of the present invention comprises a NOR type first dynamic circuit of receiving a first clock, data and pre-inverted data, the pre-inverted data being an inverted value of a previous value of the data, and wherein a first output node is charged during a first period which is one of a period from rising to falling of the first clock and a period of falling to rising of the first clock, and during a second period which is the other period, electric charge of the first output node is discharged when the data and the pre-inverted data match, i.e., both are Low or High, a NAND type second dynamic circuit of receiving a second clock and a signal of the first output node of the first dynamic circuit, wherein, during a first period or a second period of the second clock, electric charge of a second output node is held when the electric charge of the first output node is discharged, while the electric charge of the second output node is discharged when the electric charge of the first output node is held, a NOR type third dynamic circuit of receiving a third clock, the data and inverted data thereof, and the pre-inverted data and the data which is an inverted value of the pre-inverted data, wherein, during a first period of the third clock, a third output node is charged, and during the second period, electric charge of the third output node is held when the data and the pre-inverted data match or the inverted data and the previous data match, and a NAND type fourth dynamic circuit of receiving a fourth clock and a signal of the third output node of the third dynamic circuit, wherein, during a first period of the fourth clock, electric charge of a fourth output node is discharged when the electric charge of the third output node is held. The second dynamic circuit receives a signal of the fourth output node of the fourth dynamic circuit, and when electric charge of the fourth output node is discharged, the electric charge of the second output node is held even when the electric charge of the first output node of the first dynamic circuit is held.

In an example of the semiconductor integrated circuit of the present invention, the NOR type third dynamic circuit and the NAND type fourth dynamic circuit are physically arranged closer to the NAND type second dynamic circuit than to the NOR type first dynamic circuit.

In an example of the semiconductor integrated circuit of the present invention, the NOR type third dynamic circuit and the NAND type fourth dynamic circuit operate with higher speed than that of the NOR type first dynamic circuit.

In an example of the semiconductor integrated circuit of the present invention, the NOR type third dynamic circuit and the NAND type fourth dynamic circuit have a higher supply voltage than that of the NOR type first dynamic circuit.

In an example of the semiconductor integrated circuit of the present invention, the NOR type third dynamic circuit and the NAND type fourth dynamic circuit are physically arranged at a larger distance from an isolation region formed on a semiconductor substrate than from the NOR type first dynamic circuit.

In an example of the semiconductor integrated circuit of the present invention, the semiconductor integrated circuit further comprises an output circuit of receiving the selected data and outputting the selected data. The output circuit comprises a NOR circuit of receiving an output of the NOR type first dynamic circuit and an inverted output of the NAND type second dynamic circuit, a first n-type transistor of receiving the output of the NOR circuit through a gate thereof, and a first p-type transistor of receiving an output of the NAND type second dynamic circuit through a gate thereof. A drain of the first n-type transistor and a drain of the first p-type transistor are connected to each other.

In an example of the semiconductor integrated circuit of the present invention, the output circuit further comprises a second n-type transistor of receiving an output of the NAND type fourth dynamic circuit through a gate thereof. A drain of the second n-type transistor is connected to a source of the first n-type transistor.

In an example of the semiconductor integrated circuit of the present invention, the holding circuit of holding the selected data is connected to the drain of the first n-type transistor and the drain of the first p-type transistor which are two output terminals of the output circuit.

In an example of the semiconductor integrated circuit of the present invention, the holding circuit comprises a first inverter circuit to whose input side the drain of the first p-type transistor of the output circuit is connected, a second inverter circuit of receiving an output of the first inverter circuit, wherein the first n-type transistor and the first p-type transistor are connected in series, and a second n-type transistor of receiving an output of the NAND type second dynamic circuit. The second n-type transistor is disposed between the n-type transistor and the p-type transistor of the second inverter circuit or between the n-type transistor of the second inverter circuit and the ground.

In an example of the semiconductor integrated circuit of the present invention, the semiconductor integrated circuit further comprises an output circuit of receiving the selected data and outputting the selected data. The output circuit comprises a differential circuit having two differential input terminals and a differential output terminal, and an OR circuit of receiving an output of the NOR type first dynamic circuit and an inverted output of the NAND type second dynamic circuit. An output of the OR circuit is input to one of the differential input terminals of the differential circuit. An output of the NAND type second dynamic circuit is input to the other of the differential input terminals of the differential circuit.

In an example of the semiconductor integrated circuit of the present invention, the differential circuit comprises a control transistor which allows the differential circuit to perform a differential amplification operation. The control transistor includes an n-type transistor, wherein a drain of the n-type transistor is connected to a source of the differential circuit, a source of the n-type transistor is connected to the ground, and the n-type transistor receives a control signal through a gate thereof.

In an example of the semiconductor integrated circuit of the present invention, resistors are connected in parallel to the control transistor.

In an example of the semiconductor integrated circuit of the present invention, the semiconductor integrated circuit further comprises a signal generation circuit of generating a control signal which is supplied to the gate of the control transistor. The signal generation circuit comprises a short pulse generation circuit of generating a short pulse from a clock signal, and a NAND circuit of receiving the short pulse and an output of the NAND type fourth dynamic circuit. An output of the NAND circuit is supplied as the control signal to the gate of the control transistor.

In an example of the semiconductor integrated circuit of the present invention, transistors included in the NOR type third dynamic circuit and the NAND type fourth dynamic circuit have a threshold voltage lower than that of a transistor included in the NOR type first dynamic circuit.

In an example of the semiconductor integrated circuit of the present invention, the first, second, third and fourth clock signals are the same clock signal.

In an example of the semiconductor integrated circuit of the present invention, an inverted node of the third output node of the third dynamic circuit is connected to the second dynamic circuit. The second dynamic circuit discharges electric charge of the second output node thereof when electric charge is charged in the inverted node of the third output node and electric charge of the fourth output node of the fourth dynamic circuit is held. The second dynamic circuit holds electric charge of the second output node thereof when electric charge of the inverted node of the third output node is held and electric charge of the fourth output node is discharged.

In an example of the semiconductor integrated circuit of the present invention, the third dynamic circuit has a first n-type transistor having a gate to which the third clock signal is input, a second group of n-type transistors having sources connected in common to a drain of the first n-type transistor, and a third group of n-type transistors having sources connected in common to sources of the second group of n-type transistors. A potential of at least one of gates of the second group of n-type transistors is set to be a power source potential, and a potential of the other gates are set to be a ground potential. Gates of the third group of n-type transistors are connected to any of the plurality of selection signals, and drains of the third group of n-type transistors are connected in common to the third output node. An inverted node of the third output node of the third dynamic circuit is connected to the second dynamic circuit. The third output node and an inverted node of the drains connected in common of the second group of n-type transistors are connected to the fourth dynamic circuit. The second dynamic circuit discharges electric charge of the second output node thereof when electric charge is charged in the inverted node of the third output node and electric charge of the fourth output node of the fourth dynamic circuit is held. The second dynamic circuit holds electric charge of the second output node thereof when electric charge of the inverted node of the third output node is held and electric charge of the fourth output node is discharged.

In an example of the semiconductor integrated circuit of the present invention, the third dynamic circuit has a first n-type transistor having a gate to which the third clock signal is input, and a third group of n-type transistors having sources connected in common. Gates of the third group of n-type transistors are connected to any of the plurality of selection signals, and drains of the third group of n-type transistors are connected in common to the third output node. The fourth dynamic circuit discharges electric charge of the fourth output node thereof when electric charge of the third output node is held. The fourth dynamic circuit holds electric charge of the fourth output node when electric charge of the third output node is discharged.

In an example of the semiconductor integrated circuit of the present invention, the third dynamic circuit further includes a first p-type transistor having a gate to which the third clock signal is input and a drain connected to the sources of the third group of n-type transistors, and a second p-type transistor having a gate to which the third clock signal is input, a source connected to the drains of the third group of n-type transistors, and a drain connected to the sources of the third group of n-type transistors.

In an example of the semiconductor integrated circuit of the present invention, the electric charge charged to the first output node is supplied from the third output node.

In an example of the semiconductor integrated circuit of the present invention, the electric charge charged to the second output node is supplied from the first output node.

In an example of the semiconductor integrated circuit of the present invention, the electric charge charged to the fourth output node is supplied from the first output node.

In an example of the semiconductor integrated circuit of the present invention, the first dynamic circuit comprises a first p-type transistor having a gate connected to an inverted output of the first output node of the first dynamic circuit, and a second p-type transistor connected to the first clock signal. The first p-type transistor and the second p-type transistor are connected in series, and a source of one of the p-type transistors is connected to a power source, and a drain of the other p-type transistor is connected to the fourth output node or the second output node.

In an example of the semiconductor integrated circuit of the present invention, a potential of at least one of the gates of the second group of n-type transistors is connected via a potential setting transistor to the power source potential, and the second group of n-type transistors and the potential setting transistor are provided in the same standard cell.

In an example of the semiconductor integrated circuit of the present invention, the potential setting transistor is the p-type transistor having a drain connected to the at least one gate of the second group of n-type transistors. In said same standard cell, an n-type transistor having a source grounded, and a drain and a gate connected to the potential setting transistor.

Another semiconductor integrated circuit comprises two of the above-described semiconductor integrated circuits. Sources and the drains of the first n-type transistors of the two semiconductor integrated circuits are connected in common to each other, respectively, and sources and the drains of the first p-type transistors of the two semiconductor integrated circuits are connected in common to each other, respectively.

Another semiconductor integrated circuit of the present invention comprises two of the above-described semiconductor integrated circuits. The output circuits of the two semiconductor integrated circuits are used to form a logic.

In an example of the semiconductor integrated circuit of the present invention, the semiconductor integrated circuit further comprises a first inverter circuit which is connected to the drains of the first p-type transistors of the output circuits of the two semiconductor integrated circuits in common, and a second inverter circuit which receives an output of the first inverter, wherein the first inverter circuit and the second inverter circuit constitute a holding circuit. The second inverter circuit comprises an n-type transistor and a p-type transistor, and an n-type transistor having a gate shared with the corresponding first p-type transistor of the two output circuits is provided in series between the n-type transistor and the p-type transistor of the second inverter circuit or between the n-type transistor of the second inverter circuit and the ground.

Another semiconductor integrated circuit of the present invention comprises the above-described semiconductor integrated circuit and a static flip-flop. The output circuit receives an output of the static flip-flop and outputs any one of the selected data and the output of the static flip-flop.

In an example of the semiconductor integrated circuit of the present invention, scan test data is input to the static flip-flop.

Thus, according to the present invention, in the dynamic flip-flop circuit with a data selection function, for example, when the output signal of the data selection circuit is high, and thereafter, none of the selection signals is activated so that none of the data is selected, this situation is detected and the output signal of the data selection circuit is held high. Therefore, an erroneous operation does not occur.

In addition, according to the present invention, when the input data matches a value of the output signal of the holding circuit, an operation of the holding circuit or the like can be stopped. As a result, a needless operation can be suppressed, thereby reducing power consumption.

DESCRIPTION OF THE PREFERRED EMBODIMENTS

Hereinafter, the present invention will be described by way of preferable illustrative examples with reference to the accompanying drawings.

EXAMPLE 1

Figure 1:
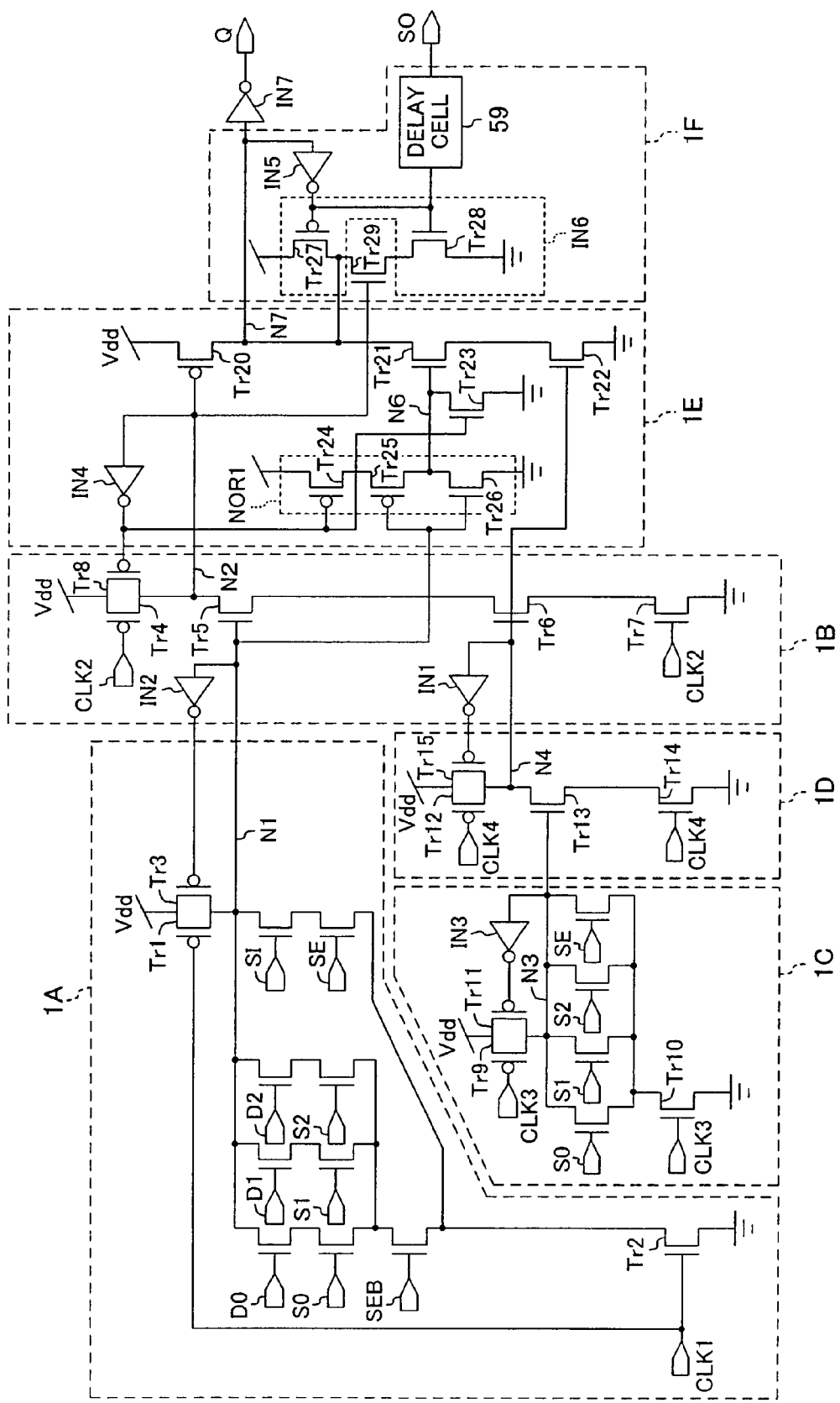
FIG. 1 is a diagram illustrating a semiconductor integrated circuit according to Example 1 of the present invention.

FIG. 1 illustrates a semiconductor integrated circuit according to Example 1 of the present invention.

In FIG. 1, D0, D1 and D2 indicate data; S0, S1 and S2 indicate selection signals which are used to select the data D0 to D2, respectively; SI indicates a data input when scanning is performed; SE indicates a scan shift control signal which is used to perform a scan shift operation; SEB indicates an inverted signal of the scan shift control signal; and Q and SO indicate output terminals.

The semiconductor integrated circuit of FIG. 1 has a first dynamic circuit 1A of NOR type, a second dynamic circuit 1B of NAND type, a third dynamic circuit 1C of NOR type, a fourth dynamic circuit 1D of NAND type, an output circuit 1E, and a holding circuit 1F. The output circuit 1E and the holding circuit 1F constitute a dynamic flip-flop circuit.

The first dynamic circuit 1A of NOR type receives the three pieces of data D0 to D2, the three selection signals S0 to S2, and a first clock CLK1, and has two p-type MOS transistors Tr1 and Tr3 and an n-type MOS transistor Tr2.

The first dynamic circuit 1A controls the selection signals S0 to S2 to be all Low during a first period which is a half period of the first clock CLK1 from falling to rising (i.e., the first clock CLK1 is Low). Therefore, during the first period, the p-type transistor Tr1 is ON and a first output node N1 is precharged to a power source voltage Vdd. Thereafter, during a second period which is a half period of the first clock CLK1 from rising to falling (i.e., the first clock CLK1 is High), the p-type transistors Tr1 and Tr3 are OFF, while the n-type transistor Tr2 is ON, so that any one of the selection signals S0 to S2 is controlled to be High. Therefore, during the second period, the potential of the first output node N1 is determined depending on the value of one of the data D0 to D2 which is selected using the selection signal which is controlled to be High. For example, when the data D0 is Low, the precharged state of the first output node N1 is held and the first output node N1 is held at the power source potential Vdd. On the other hand, when the data D0 is High, the electric charge of the first output node N1 is discharged via the n-type transistor Tr2, so that the potential of the first output node N1 becomes equal to the ground potential.

The second dynamic circuit 1B of NAND type receives a second clock CLK2 and a signal from the first output node N1 of the first dynamic circuit 1A. Further, the second dynamic circuit 1B of NAND type has two p-type MOS transistors Tr4 and Tr8, three n-type MOS transistors Tr5 to Tr7. The gate of the n-type transistor Tr5 receives a signal from the first output node N1 of the first dynamic circuit 1A.

In the second dynamic circuit 1B, during a first period in which the second clock CLK2 is Low, the p-type transistor Tr4 is ON and the n-type transistor Tr7 is OFF. Therefore, in this case, a second output node N2 is precharged to the power source potential Vdd. Thereafter, during a second period in which the second clock CLK2 is High, the precharge operation is stopped and the n-type transistor Tr5 is turned ON/OFF, depending on the potential of the first output node N1 of the first dynamic circuit 1A. For example, when Low data D0 is selected, the n-type transistor Tr5 is turned OFF and the precharged state of the second output node N2 is held. On the other hand, when High data D0 is selected, the n-type transistor Tr5 is turned ON and the electric charge of the second output node N2 is discharged via the two n-type transistors Tr5 and Tr7. The n-type transistor Tr6 is an important transistor for Example 1, and a function thereof will be described below.

The third dynamic circuit 1C of NOR type receives a third clock CLK3, the three selection signals S0 to S2, and the scan shift control signal SE, and has two p-type transistors Tr9 and Tr11, an n-type transistor Tr10, and an inverter IN3.

In the third dynamic circuit (non-selected state detection circuit) 1C, during a first period in which the third clock CLK3 is Low, the p-type transistor Tr9 is turned ON and the n-type transistor Tr10 is turned OFF, so that a third output node N3 is precharged to the power source potential Vdd. Thereafter, during a second period in which the third clock CLK3 is High, when all of the three selection signals S0 to S2 and the scan shift control signal SE are Low (i.e., none of the data D0 to D2 is selected), the precharged state of the third output node N3 is held and this state is detected. On the other hand, when any one of the selection signals goes to High, the electric charge of the third output node N3 is discharged via the n-type transistor Tr10, so that the potential thereof becomes Low.

Further, the fourth dynamic circuit 1D of NAND type receives a fourth clock CLK4 and a signal of the third output node N3 of the third dynamic circuit 1C, and has two p-type MOS transistors Tr12 and Tr15 and two n-type MOS transistors Tr13 and Tr14. The gate of the n-type MOS transistor Tr13 receives the signal of the third output node N3 of the third dynamic circuit 1C.

In the fourth dynamic circuit 1D of NAND type, during a first period in which the fourth clock CLK4 is Low, the p-type transistor Tr12 is ON and the n-type MOS transistor Tr14 is OFF, so that a fourth output node N4 is precharged to the power source potential Vdd. On the other hand, during a second period in which the fourth clock CLK4 is High, the p-type transistor Tr12 is OFF, so that the precharge operation is stopped and the n-type MOS transistor Tr14 is ON. Therefore, the potential of the fourth output node N4 is determined, depending on the ON/OFF of the n-type transistor Tr13. In other words, during the second period, the electric charge of the third output node N3 of the third dynamic circuit 1C is held. In other words, in an ordinary operation, when all of the selection signals S0 to S2 are Low and none of the data D0 to D2 is selected, the electric charge of the fourth output node N4 is discharged via the n-type transistors Tr13 and Tr14, so that the potential of the fourth output node N4 becomes Low. On the other hand, when High data is selected from any one of the selection signals S0 to S2 and the electric charge of the third output node N3 of the third dynamic circuit 1C is discharged, the n-type MOS transistor Tr13 is turned OFF, so that the precharged state of the fourth output node N4 is held.

The second dynamic circuit 1B of NAND type is provided with the n-type MOS transistor Tr6 which receives via its gate a signal of the fourth output node N4 of the fourth dynamic circuit 1D. The n-type transistor Tr6 is connected in series to the n-type transistor Tr5. When the n-type transistor Tr5 is ON and the n-type transistor Tr6 is OFF, the electric charge of the second output node N2 is not discharged, so that the precharged state thereof is held.

In Example 1, in the second dynamic circuit 1B of NAND type, when none of the data D0 to D2 is selected and the n-type transistor Tr5 is ON, the n-type transistor Tr6 needs to be already OFF. To achieve this, the third and fourth dynamic circuits 1C and 1D which control the n-type transistor Tr6 have a structure which allows a higher-speed operation than that of the first dynamic circuit 1A. For example, the third dynamic circuit 1C has two transistors connected in series on a pathway from the third output node N3 to the ground, while the first dynamic circuit 1A has three transistors connected in series on a pathway from the first output node N1 to the ground. Therefore, the third dynamic circuit 1C has a higher operating speed than that of the first dynamic circuit 1A. In addition, the third and fourth dynamic circuits 1C and 1D are disposed nearer the second dynamic circuit 1B than the first dynamic circuit 1A. As a result, a delay time required for a change in the potentials of the third and fourth output nodes N3 and N4 of the third and fourth dynamic circuits 1C and 1D to be propagated to the n-type transistor Tr6 of the second dynamic circuit 1B is reduced to be shorter than a delay time required for a potential change of the first output node N1 of the first dynamic circuit 1A to be propagated to the n-type transistor Tr5 of the second dynamic circuit 1B.

Figure 2:
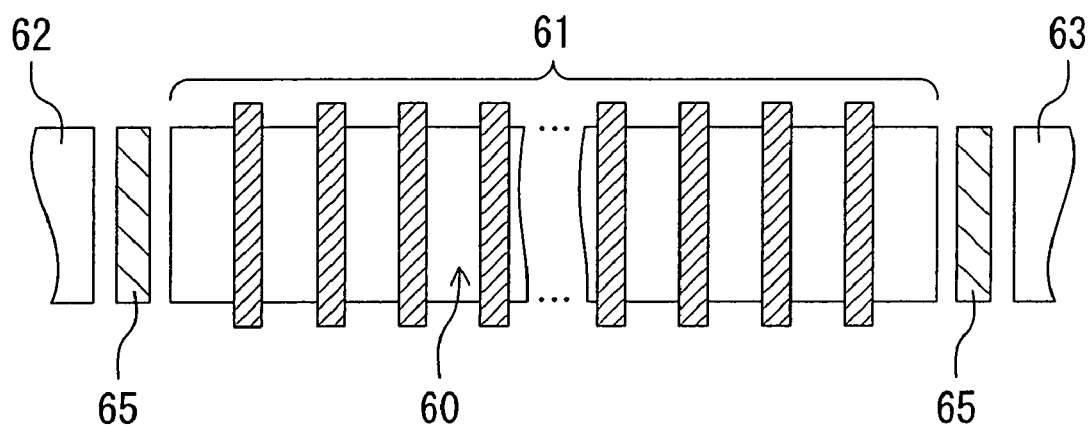
FIG. 2 is a diagram illustrating an outline of a layout structure of a major portion of the semiconductor integrated circuit.

Further, in order to cause the third and fourth dynamic circuits 1C and 1D to operate with higher speed than that of the first dynamic circuit 1A, a voltage supplied to the third and fourth dynamic circuits 1C and 1D may be set to be higher than that of the first dynamic circuit 1A; the threshold voltage of an MOS transistor included in the third and fourth dynamic circuits 1C and 1D may be set to be lower than the threshold voltage of an MOS transistor included in the first dynamic circuit 1A; or a size of the MOS transistor included in the third and fourth dynamic circuits 1C and 1D may be set to be larger than a size of the MOS transistor included in the first dynamic circuit 1A. Further, when an STI (Shallow Trench Isolation region) is formed on the semiconductor substrate, it is expected that the performance of the transistor is deteriorated due to an influence of the STI, and therefore, the arrangement or configuration may be adapted in consideration of the influence of the STI. For example, as shown in FIG. 2, when a transistor series 61 is formed on an N-type substrate 60, a plurality of transistors of the transistor series 61 which are positioned at an edge thereof, are used to constitute an n-type transistor of the first dynamic circuit 1A, while a plurality of transistors of the transistor series 61 which are positioned in an inside thereof, are used to constitute an n-type transistor in the third and fourth dynamic circuits 1C and 1D. With this structure, an isolation region (STI) 65 is provided between the transistor series 61 and other transistor series 62 and 63 on the N-type substrate 60. Therefore, a transistor located at the edge of the transistor series 61 is significantly deteriorated due to the influence of the STI. However, this transistor is the n-type transistor of the first dynamic circuit 1A for which a high operating speed is not required, and therefore, the deterioration has less influence. On the other hand, the n-type transistors of the third and fourth dynamic circuits 1C and 1D for which a high operating speed is required, are composed of transistors which are located in the inside of the transistor series 61 so that they are not significantly influenced by the STI. Therefore, the high operating speed can be satisfactorily secured.

Although, in Example 1, the third and fourth dynamic circuits 1C and 1D are constructed to have a higher operating speed than that of the first dynamic circuit 1A, the present invention is not limited to this, i.e., this structure is not necessarily adopted. For example, although the second clock CLK2 is input to the gate of the n-type transistor Tr7 of the second dynamic circuit 1B in the semiconductor integrated circuit of FIG. 1, an inverted signal of the third output node N3 of the third dynamic circuit 1C may be input instead of the second clock CLK2. In the case of this structure, when none of the data is selected (i.e., all of the selection signals S0 to S2 are Low) before rising of the fourth clock CLK4, the third output node N3 becomes High, so that the n-type transistor Tr7 is turned OFF. Thereafter, when the fourth clock CLK4 rises, the fourth output node N4 becomes Low, so that the n-type transistor Tr6 is turned OFF. Therefore, the third and fourth dynamic circuits 1C and 1D do not have to be constructed so that their operating speed is higher than that of the first dynamic circuit 1A.

Next, the output circuit 1E and the holding circuit 1F which are the remaining portion of the dynamic flip-flop circuit will be described. The output circuit 1E receives a signal of the first output node N1 of the first dynamic circuit 1A and a signal of the second output node N2 of the second dynamic circuit 1B, and comprises an inverter IN4, a NOR circuit NOR1, a first p-type MOS transistor Tr20, and three n-type MOS transistor Tr21, Tr22 and Tr23. The drain of the p-type MOS transistor Tr20 and the drain of the first the n-type transistor Tr21 are connected to each other to form a seventh output node N7. A signal of the second output node N2 of the second dynamic circuit 1B is input to the gate of the p-type MOS transistor Tr20. The NOR circuit NOR1 comprises two p-type transistors Tr24 and Tr25 and an n-type transistor Tr26, and receives a signal of the first output node N1 of the first dynamic circuit 1A and a signal obtained by inverting a signal of the second output node N2 of the second dynamic circuit 1B using the inverter IN4, and outputs a signal as a sixth output node N6 to the gate of first the n-type transistor Tr21.

Therefore, in the output circuit 1E, when the second output node N2 of the second dynamic circuit 1B is Low and the first output node N1 of the first dynamic circuit 1A is High, the p-type transistor Tr20 is turned ON and the n-type transistor Tr21 is turned OFF, so that the seventh output node N7 is precharged to the power source potential Vdd, i.e., the potential there of becomes High. On the other hand, when the second output node N2 is High and the first output node N1 is Low, the p-type transistor Tr20 is turned OFF and the n-type transistor Tr21 is turned ON, so that the electric charge of the seventh output node N7 is discharged, i.e., the potential thereof becomes Low.

In the output circuit 1E, the gate of the second n-type transistor Tr22 receives a signal of the fourth output node N4 of the fourth dynamic circuit 1D, the source of the second n-type transistor Tr22 is grounded, and the drain of the second n-type transistor Tr22 is connected to the source of the n-type transistor Tr21. In the n-type transistor Tr22, when the potential of the seventh output node N7 is High, the output of the NOR circuit NOR1 (sixth output node N6) becomes High due to a reduction in the potential of the first output node N1 of the first dynamic circuit 1A. In this case, even if the n-type transistor Tr21 is turned ON, since the n-type transistor Tr22 is held in the OFF state, the potential of the seventh output node N7 is prevented from erroneously becoming Low and a through current is prevented.

Next, the holding circuit 1F will be described. The holding circuit 1F functions as a feedback buffer, and comprises a first inverter IN5 and a second inverter IN6. The seventh output node N7 of the holding circuit 1E is connected to the input side of the first inverter IN5. The inverter IN5 is connected to the input side of the second inverter IN6. The output side of the second inverter IN6 is connected to the seventh output node N7. Further, the holding circuit 1F comprises a first p-type MOS transistor Tr27 and a first n-type MOS transistor Tr28 which constitute the second inverter IN6, a second n-type MOS transistor Tr29, and a delay cell 59. The second n-type MOS transistor Tr29 is disposed in series between the first p-type MOS transistor Tr27 and the first n-type MOS transistor Tr28. The inverters IN5 and IN6 each hold the potential of the seventh output node N7 of the holding circuit 1E. The held potential is inverted by the inverter IN7 before being output through the output terminal Q. An output of the first inverter IN5 is delayed by a predetermined time in the delay cell 59 before being output through the output terminal SO.

In the holding circuit 1F, the gate of the n-type MOS transistor Tr29 receives a signal of the second output node N2 of the second dynamic circuit 1B, the drain of the n-type MOS transistor Tr29 is connected to the drain of the p-type transistor Tr27, and the source of the n-type MOS transistor Tr29 is connected to the drain of the n-type transistor Tr28. The n-type transistor Tr29 has the following function. Specifically, when the seventh output node N7 of the output circuit 1E is Low, the output node N7 is grounded via the n-type transistor Tr28 of the second inverter IN6. When the second output node N2 of the second dynamic circuit 1B starts going from High to Low, the p-type transistor Tr20 of the output circuit 1E is turned ON, so that the seventh output node N7 starts being precharged to the power source potential Vdd. In this case, the n-type transistor Tr29 is turned OFF by causing the second output node N2 to be Low, so that a pathway from the seventh output node N7 via the n-type transistor Tr28 to the ground is cut off, thereby promoting the precharge operation of the seventh output node N7.

Next, an operation of the semiconductor integrated circuit of Example 1 will be described with reference to a timing chart illustrated in FIG. 4. For the sake of simplicity, it is assumed that first to fourth clocks CLK1 to CLK4 are the same clock CLK.

During a first period of the clock CLK, the data D0 is High in a data valid period (a time satisfying setup and hold times) before and after the rising of the clock, and after the data valid period has passed, the data D0 becomes Low. The other data D1 and D2 are High. The selection signal S0 is Low during the data valid period and becomes High after the data valid period has passed. The other selection signals S1 and S2 are Low. Therefore, during the first period, none of the data D0 to D2 is selected.

Figure 3A:
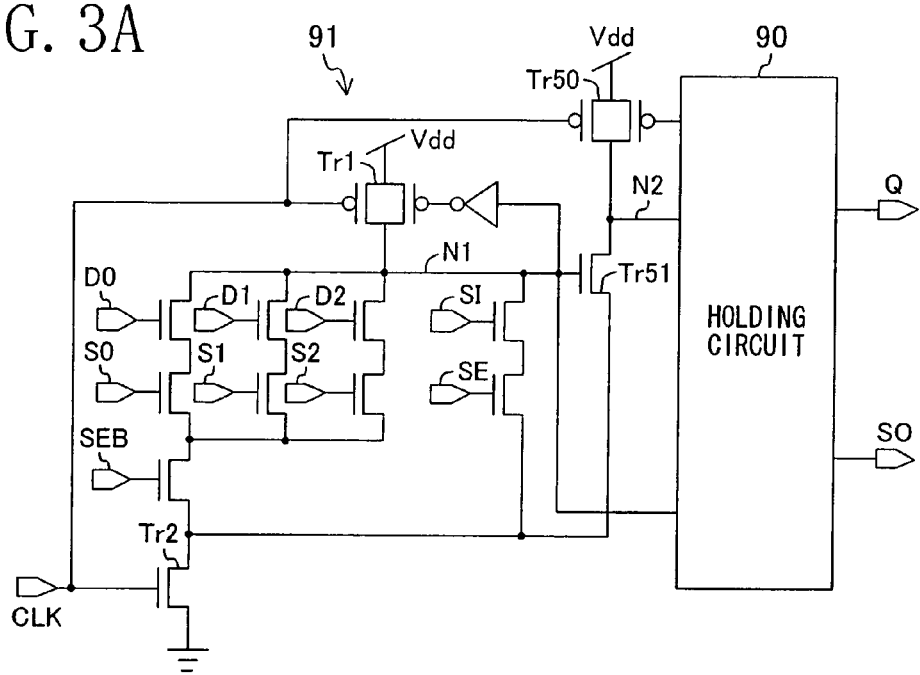
FIG. 3A is a diagram illustrating a major structure of a conventional semiconductor integrated circuit.

In this state, during the data valid period, the first output node N1 of the first dynamic circuit 1A is High, and therefore, the n-type transistor Tr5 is turned ON in the second dynamic circuit 1B. As a result, in the conventional example of FIG. 3A, when the second output node N2 is High, the second output node N2 erroneously goes to Low, so that the flip-flop circuit erroneously outputs an "L" signal instead of a true "H" signal.

However, in Example 1, the third output node N3 of the third dynamic circuit 1C is High, and the fourth output node N4 of the fourth dynamic circuit 1D becomes Low after rising of the clock. Therefore, in the second dynamic circuit 1B, the n-type transistor Tr6 is turned OFF before the n-type transistor Tr5 is turned ON, so that the second output node N2 is prevented from erroneously becoming Low, i.e., the second output node N2 is held High. Therefore, in the output circuit 1E, the seventh output node N7 is held Low, so that the holding circuit 1F outputs the true "H" signal.

On the other hand, it is now assumed that the seventh output node N7 of the output circuit 1E is held High. For example, even if the selection signal S2 becomes High after rising of the clock CLK and the first output node N1 of the first dynamic circuit 1A becomes Low (not shown), the sixth output node N6 becomes High in the output circuit 1E, so that the n-type transistor Tr21 is turned ON. In this case, however, the n-type transistor Tr22 is turned OFF, so that the seventh output node N7 is not grounded, so that the seventh output node N7 is held High. This is because, in the OFF operation of the n-type transistor Tr22, even when the third output node N3 of the third dynamic circuit 1C becomes Low as the selection signal S2 goes to High, the fourth output node N4 of the fourth dynamic circuit 1D is held Low.

Figure 4:
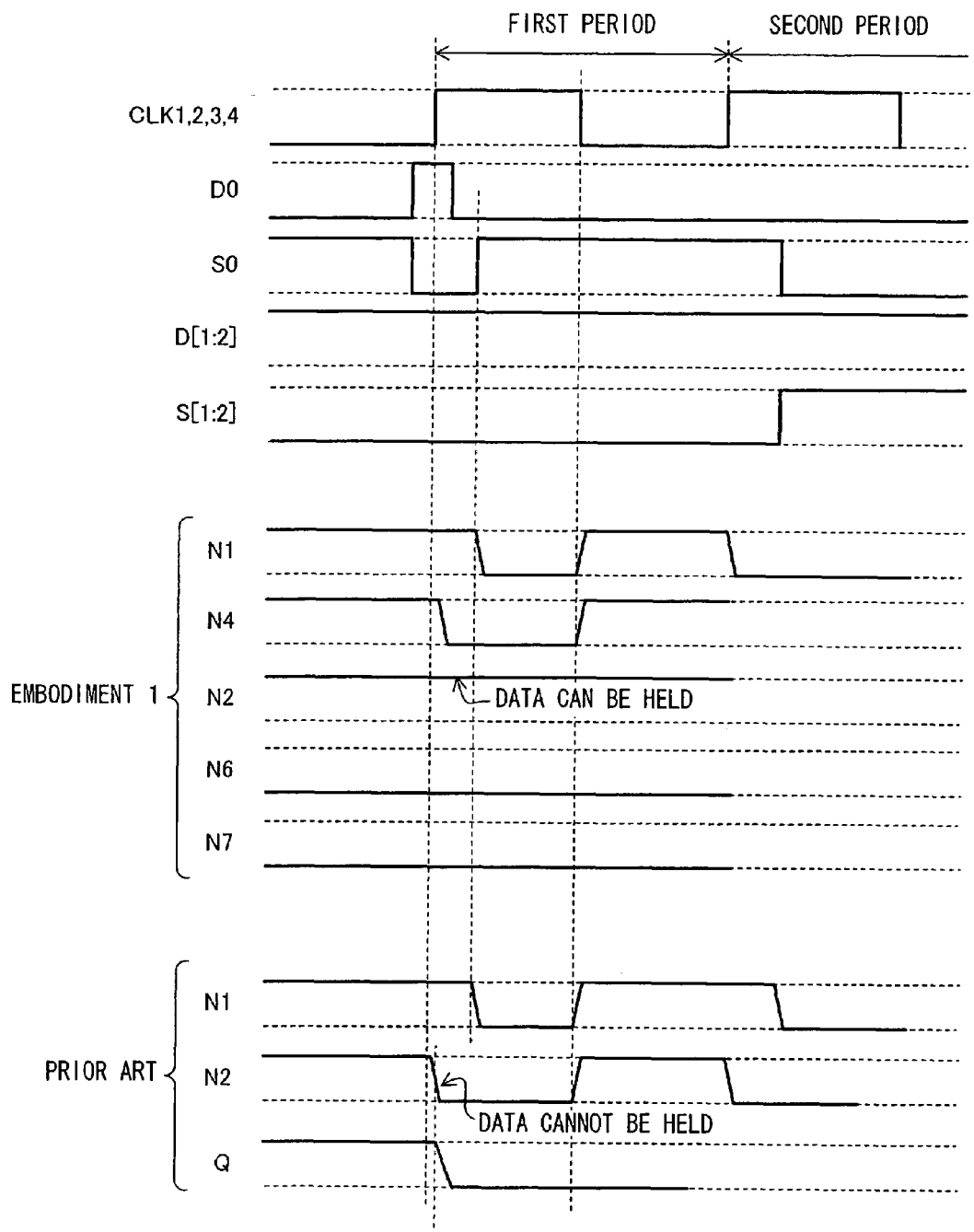
FIG. 4 is a diagram illustrating an operation timing chart of the semiconductor integrated circuit of Example 1 of the present invention.

Note that FIG. 4 illustrate that the data D0 is Low, the data D1 and D2 are High, the selection signal S0 is High, and the selection signals S1 and S2 are Low, i.e., the data D0 is selected, during the second period of the clock CLK.

Figure 3B:
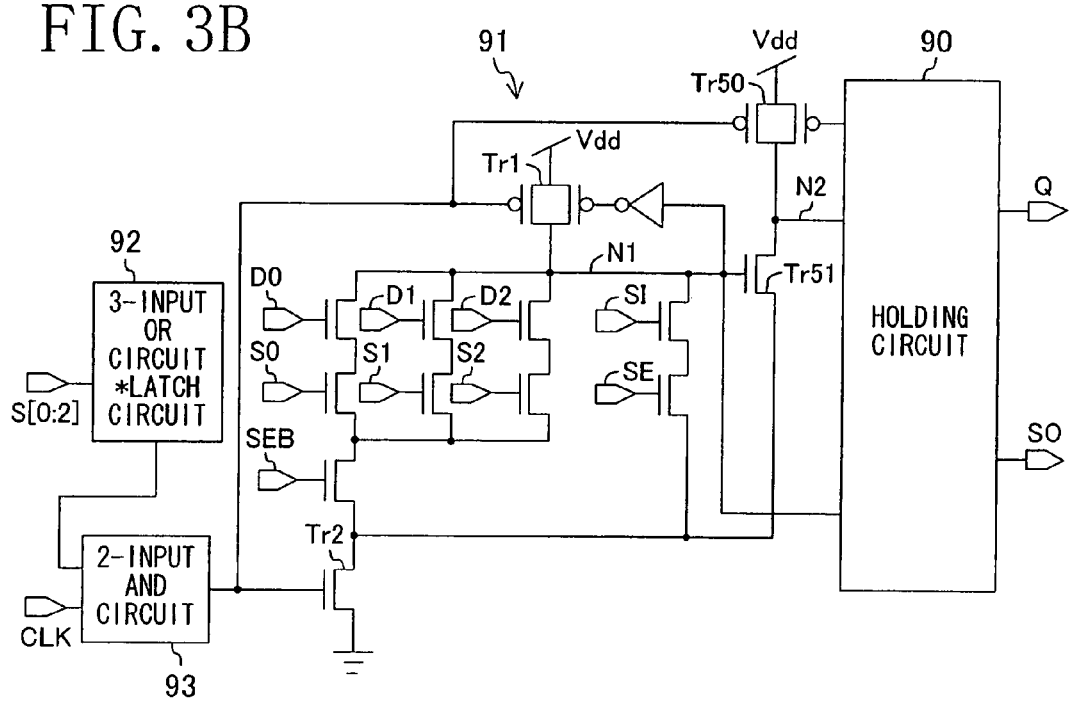
FIG. 3B is a diagram illustrating a proposed example which removing a drawback of the semiconductor integrated circuit.

In Example 1, an OR circuit or a latch circuit is not provided before the clock as illustrated in FIG. 3B, and therefore, it is not necessary to set up a selection signal, thereby making it possible to provide a dynamic flip-flop circuit capable of operating with high speed.

Although, in the above description about the operation, the first to fourth clocks CLK1 to CLK4 are the same clock which provides the same time, the clocks may have a difference in phase to some extent. In this case, it is preferable that the first clock CLK1 leads the second clock CLK2. Also, the third and fourth clocks CLK3 and CLK4 preferably lead the first and second clocks CLK1 and CLK2.

Figure 9:
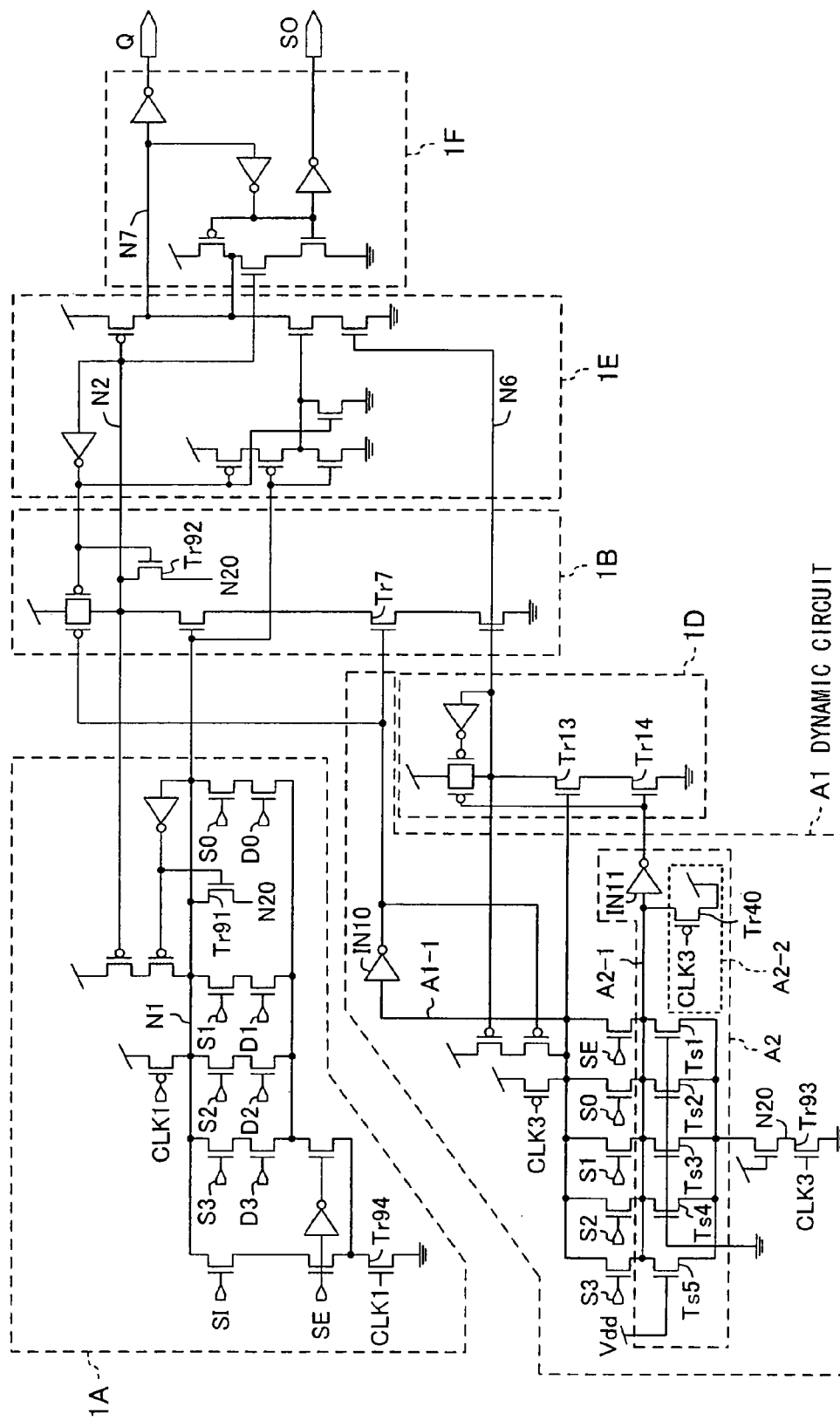
FIG. 9 is a diagram illustrating a variation of the semiconductor integrated circuit of FIG. 1.

Note that a delay value of the clock CLK2 to be input to the second dynamic circuit 1B may not be set to be a predetermined value, and the clock CLK2 may be generated based on the clock CLK3 of the third dynamic circuit 1C. A circuit structure of this case is illustrated in FIG. 9. In FIG. 9, a dynamic circuit A1 is additionally provided. The dynamic circuit A1 has a series circuit of the same number of n-type MOS transistors as the number of n-type MOS transistors connected in series in the first dynamic circuit 1A of FIG. 1. A plurality of the series circuits are connected in parallel to construct a parallel circuit portion, which is the same as that of the first dynamic circuit 1A, except for a structure of inputting a scan signal SE. An output A1-1 of the dynamic circuit A1 thus additionally provided is inverted in an inverter IN10, and is then input to the n-type transistor Tr7 of the second dynamic circuit 1B.

The dynamic circuit A1 additionally provided in FIG. 9 further includes a clock generation circuit A2 which generates a clock CLK4, which is input to the fourth dynamic circuit 1D, based on the clock CLK3 input from the third dynamic circuit 1C of FIG. 1. In the clock generation circuit A2, a junction capacitance portion of multi-input gates of data or the like is constructed to be apparently equivalent to the output point A1-1 of the dynamic circuit A1, and an output A2-1 is inverted in an inverter IN11 and is then input to the n-type transistor Tr14 of the fourth dynamic circuit 1D. The clock generation circuit A2 is further provided with a precharge circuit A2-2 composed of a p-type MOS transistor Tr40. The precharge circuit A2-2 has a function of precharging the output point A2-1 of the clock generation circuit A2. A clock input to the gate of the p-type transistor Tr40 is the clock CLK3 which is input to the third dynamic circuit 1C. A delay difference during discharge between the output A1-1 of the dynamic circuit A1 and the output A2-1 of the clock generation circuit A2 depends on a current difference between n-type MOS transistors to which the selection signals S0 to S3 are input. By compensating for the delay difference using the inverter IN11, a reliable operation can be achieved.

Note that, in the circuit of FIG. 1, when any one of the selection signals S0 to S3 is output in addition to the selection signal SE, the output may become indeterminate if the dynamic circuit A1 is transitioned earlier than the dynamic circuit 1A. However, in FIG. 9, the gates of five NMOS transistors Ts1 to Ts4, which are connected in series to transistors to which the selection signals SE and S0 to S3 are input, respectively, are grounded so as not to be conductive. Therefore, since a current path through which the electric charge is discharged from the node A2-1 to the ground is a single path via an NMOS transistor Ts5 whose gate is fixed to the power source voltage Vdd, the dynamic circuit A1 is transitioned later than the dynamic circuit 1A. As a result, data which is output to the output terminal Q is an OR output of data selected from the data D0 to D3. This structure is effective since an expected value does not become indeterminate when a scan test is performed.

Figure 10:
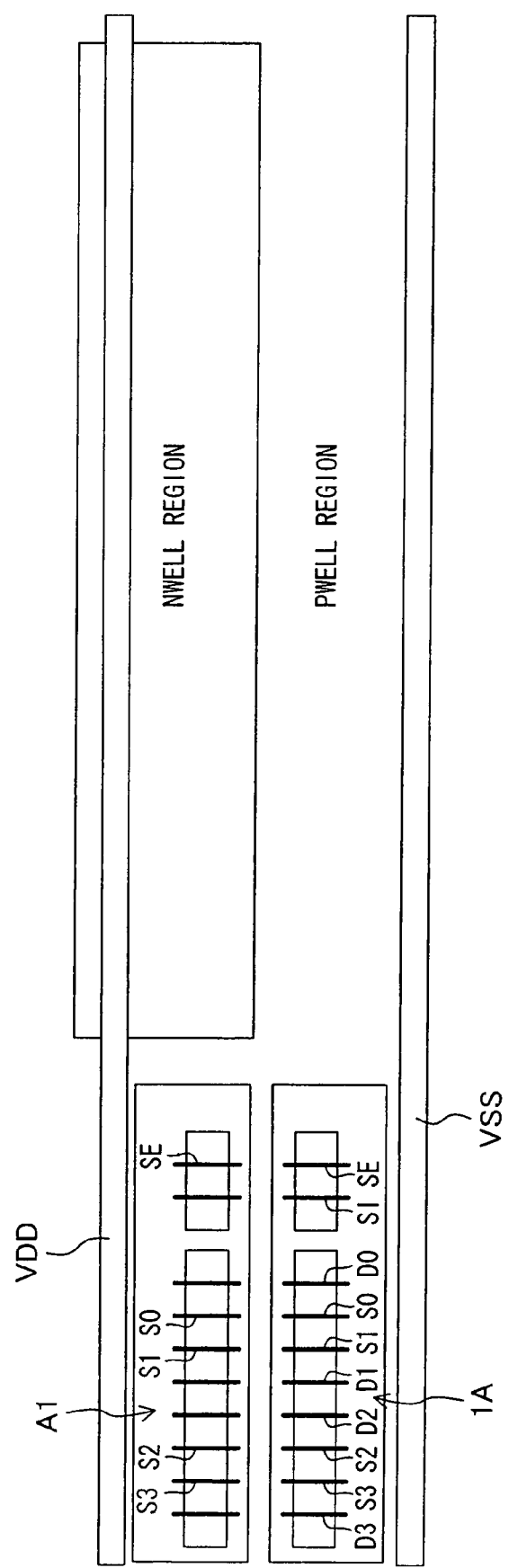
FIG. 10 is a diagram illustrating a layout structure of a major portion of the semiconductor integrated circuit of FIG. 9.

An exemplary layout structure of the semiconductor integrated circuit of FIG. 9 is illustrated in FIG. 10. In FIG. 10, a circuit portion of n-type transistors for receiving the selection signals S0 to S3 of the first dynamic circuit 1A and n-type transistors for receiving the data D0 to D3, and a circuit portion of n-type transistors for receiving the selection signals S0 to S3 of the dynamic circuit A1 of FIG. 9 are vertically arranged. As a result, the wiring capacitance of input pins is reduced. In addition, since both the circuit portions are close to each other, a variation component between the dynamic circuits 1A and A1 during the production process is reduced, and a voltage variation and a temperature variation are advantageously reduced. An input circuit portion is typically composed of a plurality of n-type transistors, which receives selection signals and data. The number of selection signals or pieces of data varies among applications. Therefore, a number of layouts having a different number of selection signals or pieces of data are required. By preparing a layout having a maximum number of inputs, a layout having a smaller number of inputs can be obtained only by reducing the number of n-type MOS transistors on the left side of FIG. 10. Therefore, the number of steps for layout can be reduced.

Note that the transistor Tr91 of the dynamic circuit 1A has a function as a keeper to hold the electric charge of the node N1. In this case, it is desirable that the source of the transistor Tr91 is connected to the drain (node N20) of the transistor Tr93 of the dynamic circuit A1. Thereby, for example, the signal transition speed of the node N1 becomes higher than when the source of the transistor Tr91 is connected to the drain of the transistor Tr94 of the dynamic circuit 1A. This is because the drain capacitance of the transistor Tr93 of the dynamic circuit A1 does not have an influence on the node N1. The same is true of the transistor Tr92 of the dynamic circuit 1B.

In addition, when the number of pieces of data to be input is considerably large, the pieces of data may be divided into two groups. For example, in a semiconductor integrated circuit of FIG. 11, a group of the first to fourth dynamic circuits 1A to 1D and A1 of FIG. 9 and another group of first to fourth dynamic circuits 1A' to 1D' and A1' having the same structure as that of the former group are provided. When the number of pieces of data is 2N, data D1 to DSN are input to one group, while data DSN+1 to D2N are input to the other group. The two groups are input in parallel to the gates of the n-type transistors Tr20 and Tr21 of the output circuit 1E of FIG. 1. Further, a selection signal matching detection circuit 1J which detects a match between the outputs A1-1 and A1-1' of the dynamic circuit A1 or a match between the outputs A2-1 and A2-1' of the clock generation circuit A2 is further provided. An output 1J-1 of the output circuit 1E of FIG. 1 is connected to the gate of the n-type transistor Tr22. With this structure, the capacitances of the first nodes N1 and N1' of the first dynamic circuits 1A and 1A' are half of a value which is obtained when only one group is provided, thereby making it possible to increase the operating speed.

EXAMPLE 2

Next, Example 2 of the present invention will be described. In Example 2, the output circuit 1E of FIG. 1 is modified as shown in FIG. 5.

Figure 5:
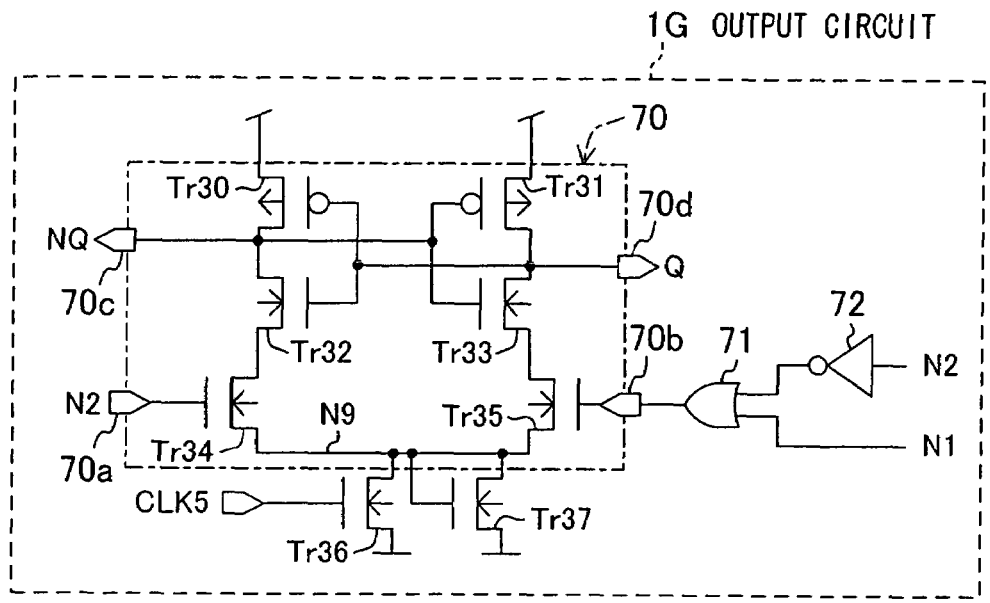
FIG. 5 is a diagram illustrating an internal structure of an output circuit included in a semiconductor integrated circuit according to Example 2 of the present invention.

Specifically, an output circuit 1G of FIG. 5 is composed of a differential circuit 70. More specifically, the differential circuit 70 has a pair of differential input terminals 70a and 70b, a pair of differential output terminals 70c and 70d, two p-type MOS transistors Tr30 and Tr31 and two n-type MOS transistors Tr32 and Tr33 which are cross-linked, and two n-type MOS transistors Tr34 and Tr35 for receiving a differential signal, to whose gates the differential input terminals 70a and 70b are connected. The differential output terminals 70c and 70d are connected to a connection point of the p-type transistor Tr30 and the n-type transistor Tr32 and a connection point of the p-type transistor Tr31 and the n-type transistor Tr33, respectively. The differential output terminals 70d and 70c are the output terminal Q and its inverted output terminal NQ of the semiconductor integrated circuit of FIG. 1, respectively.

A signal of the second output node N2 of the second dynamic circuit 1B of FIG. 1 is input to the differential input terminal 70a. An OR circuit 71 is connected to the differential input terminal 70b. A signal obtained by inverting the signal of the second output node N2 of the second dynamic circuit 1B using an inverter 72, and a signal of the first output node N1 of the first dynamic circuit 1A are input to the OR circuit 71.

Further, a control transistor Tr36 including an n-type MOS transistor is connected to a ninth node N9 which is the source of the two n-type MOS transistors Tr34 and Tr35 for receiving the differential signal. The source of the control transistor Tr36 is grounded, the drain thereof is connected to the ninth node N9, and the gate thereof receives, as a control signal, a fifth clock signal CLK5 which is generated by a clock generation circuit 1H of FIG. 6.

Figure 6:
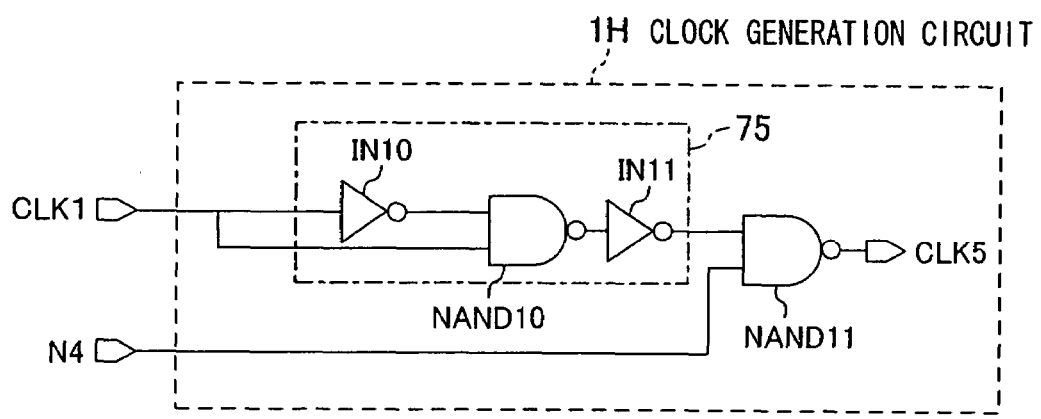
FIG. 6 is a diagram illustrating an internal structure of a circuit of generating a clock to be supplied to the output circuit.

An internal structure of the clock generation circuit 1H will be described. In FIG. 6, the clock generation circuit (signal generation circuit) 1H comprises a short pulse generation circuit 75 which generates a short pulse at the same cycle as that of the first clock CLK1, and a NAND circuit NAND11. The short pulse generation circuit 75 has an inverter IN10 which inverts a first clock CLK1, a NAND circuit NAND10 which receives outputs of the first clock CLK1 and the inverter IN10, and an inverter IN11 which inverts an output of the NAND circuit NAND10. The NAND circuit NAND11 receives an output of the inverter IN11 and a signal of the fourth output node N4 of the fourth dynamic circuit 1D of FIG. 1. An output of the NAND circuit NAND1 is a fifth clock CLK5. The clock CLK5 is input as a control signal to an n-type transistor Tr36 which is provided in the differential circuit 70 of FIG. 5 to receive a differential signal.

Figure 7:
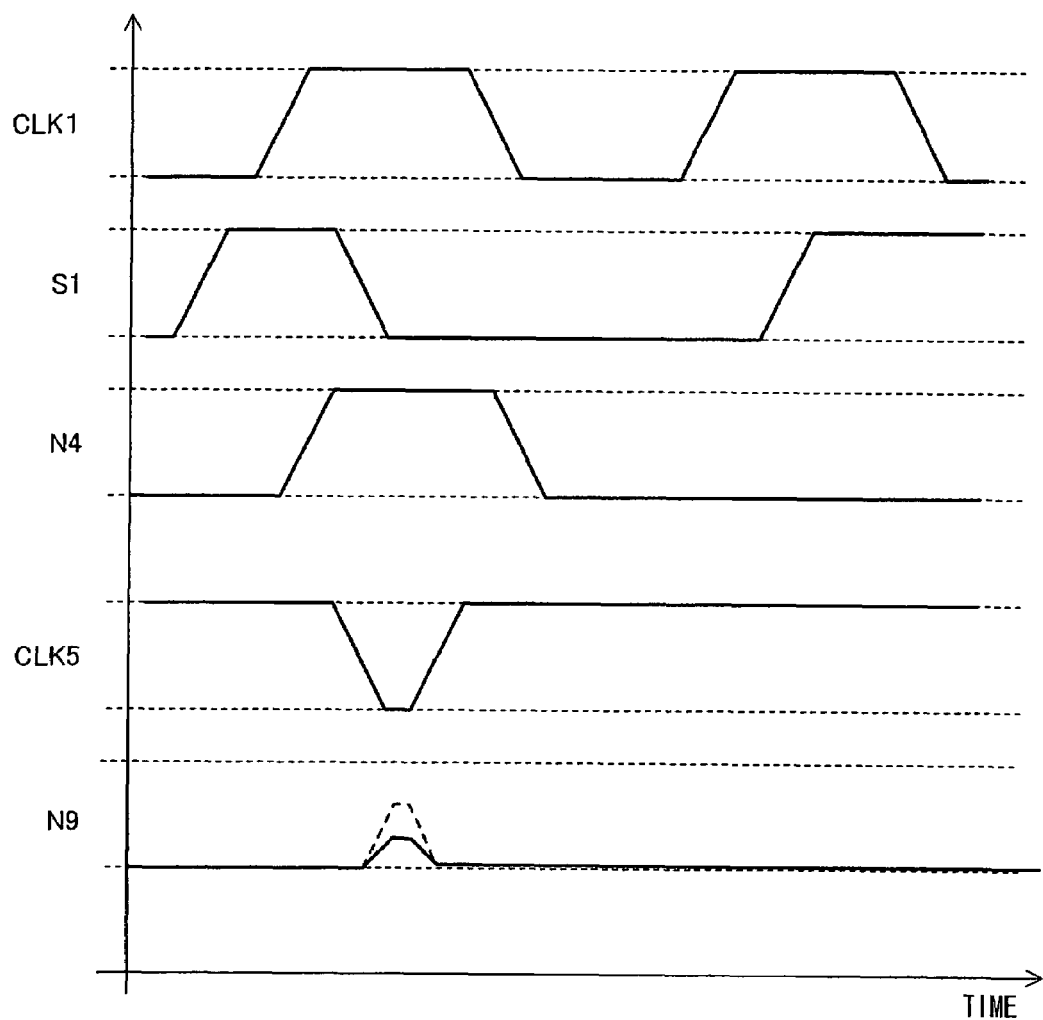
FIG. 7 is a diagram illustrating an operation timing chart of the output circuit and the clock generation circuit.

In the clock generation circuit 1H of FIG. 6, as illustrated in FIG. 7, for example, it is assumed that the selection signal S1 is High so that the data D1 is selected during the first period of the first clock CLK1. Since a signal of the fourth output node N4 of the fourth dynamic circuit 1D is High at the beginning of the first period, when a short pulse is subsequently generated by the short pulse generation circuit 75, the fifth clock CLK5 then goes from High to Low. Thereafter, when the short pulse is ended, the fifth clock CLK5 goes from Low to High. In this case, by turning ON the control transistor Tr36 partway through transition of the fifth clock CLK5 from Low to High, a differential input signal is amplified and output. In the other situations, the control transistor Tr36 is held OFF. Therefore, when the fifth clock CLK5 is High, the output circuit 70 functions as a latch which holds output data. With this structure, when the output circuit 1G of FIG. 5 is provided, the holding circuit 1F of FIG. 1 is not required after the output circuit 1G.

In FIG. 5, an n-type MOS transistor Tr37 is disposed in parallel with the control transistor Tr36 in the output circuit 1G. The source of the n-type transistor (resistor) Tr37 is grounded, and the gate and drain thereof are connected to the ninth node N9 of the differential circuit 70. There is a possibility that the potential of the ninth node N9 is increased due to leakage current when the fifth clock CLK5 is Low. In fact, the n-type transistor Tr37 functions as a resistor, thereby suppressing and preventing the increase of the potential to hold an optimum potential of the ninth node N9. As a result, the potential difference between the source and drain of the n-type transistors Tr34 and Tr35 for receiving a differential input is held to be an optimum which provides an appropriate gain, whereby a predetermined high-speed operation of the output circuit 1G is satisfactorily maintained.

In Example 2, the differential circuit 70 rapidly amplifies and outputs a small potential difference between input differential signals, thereby operating with higher speed than when data is held by the output circuit 1E in Example 1.

EXAMPLE 3

Figure 8:
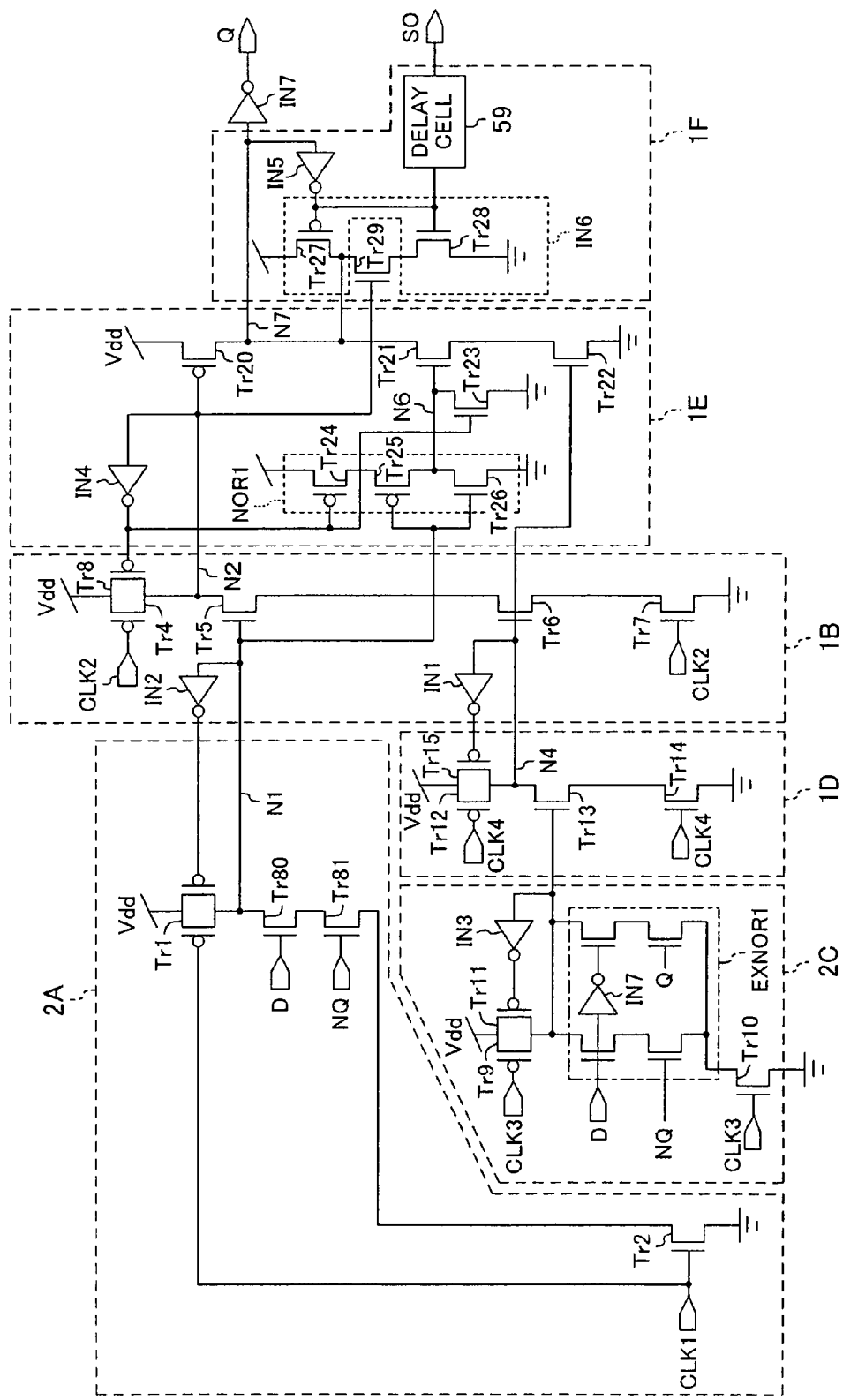
FIG. 8 is a diagram illustrating a structure of a semiconductor integrated circuit according to Example 3 of the present invention.

FIG. 8 illustrates a semiconductor integrated circuit according to Example 3 of the present invention.

The semiconductor integrated circuit of Example 3 is different from the semiconductor integrated circuit of FIG. 1 in an NOR type first dynamic circuit 2A and an NOR type third dynamic circuit 2C, and both the circuits have the same second and fourth dynamic circuits 1B and 1D, output circuit 1E and holding circuit 1F.

In the first dynamic circuit 2A, the p-type transistor Tr1 and the n-type transistor Tr2 are connected in series. To this series circuit, an n-type MOS transistor Tr80 which receives data D through the gate thereof, and another n-type MOS transistor Tr81 which receives an inverted signal NQ of the output signal Q through the gate thereof are connected in series. Therefore, in the first dynamic circuit 2A, the potential of the first output node N1 is basically determined, depending on the value of the data D. When the data D is output through the output terminal Q, the inverted output NQ of the data D is used to handle a change in the next data D.

The third dynamic circuit (matching detection circuit) 2C includes an EXNOR circuit EXNOR1. The EXNOR circuit receives the data D, the output signal Q, and inverted signals ND and NQ thereof. After rising of the third clock CLK3, only when there is a match between the data D and the output signal Q, the third output node N3 is set to be the power source potential Vdd. Therefore, in the fourth dynamic circuit 2D, when there is a match between the data D and the output signal Q, the n-type transistor Tr13 is turned ON, so that the electric charge of the fourth output node N4 is discharged. As a result, the n-type transistor Tr6 is turned OFF in the second dynamic circuit 2B.

With the structure, in the dynamic NAND circuit 2D, when the value of the data D is the same as that of the output signal Q, the output node N4 is transitioned to Low, so that the n-type transistor Tr6 of the second dynamic circuit 2B is forcedly turned OFF. Therefore, it is possible to stop operations of the following second dynamic circuit 2B, output circuit 1E and holding circuit 1F. Therefore, unnecessary operations of the circuits 2B, 1E and 1F are prevented, thereby making it possible to reduce the power of the semiconductor integrated circuit.

Note that the physical arrangement of the dynamic circuits, the size and threshold voltage characteristics of each transistor, voltages supplied to the circuits, and the like in Example 3 can be similar to those in Example 1. Further, the output circuit 1E can be replaced with the differential output circuit 1G of Example 2. In this case, a still higher speed can be achieved.

Although Example 3 illustrates an exemplary flip-flop, a latch circuit may be implemented by, for example, causing the potential of the node N2 to be an output signal. In this case, the holding circuit 1F does not have to output a signal or does not have to be provided.

EXAMPLE 4

Figure 12:
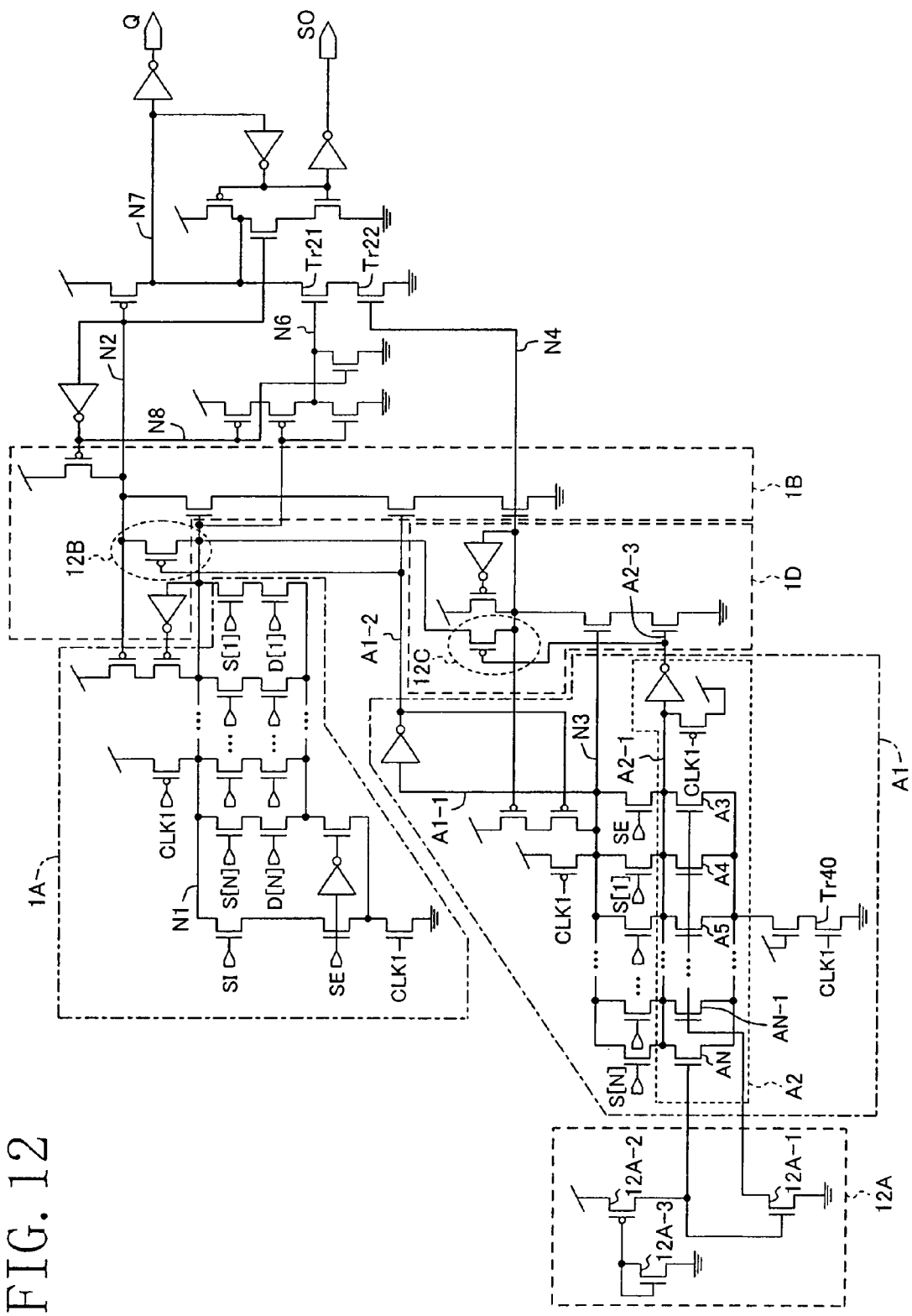
FIG. 12 is a diagram illustrating a structure of a semiconductor integrated circuit according to Example 4 of the present invention.

FIG. 12 is a circuit diagram illustrating another multi-input flip-flop according to the present invention. The multi-input flip-flop of FIG. 12 is different from those of FIGS. 1 and 9 in the flip-flop of FIG. 12 is operated with a single clock signal CLK1, and further, in that the flip-flop of FIG. 12 comprises a p-type MOS transistor 12B and a p-type MOS transistor 12C.

In FIGS. 1 and 9, p-type MOS transistors (transistors Tr4, Tr12 in FIG. 1) are provided whose sources are connected to a power source and which are used to charge the nodes N2 and N4. In the circuit of FIG. 12, a p-type MOS transistor 12B is provided whose source and drain are connected to nodes N1 and N2, respectively, and a p-type MOS transistor 12C is provided whose source and drain are connected to nodes N1 and N4, respectively. The gate of the p-type MOS transistor 12B is connected to a node A1-2. The gate of the p-type MOS transistor 12C is connected to a node A2-3. This circuit employs only one clock signal, thereby making it possible to reduce power consumption, and avoid an erroneous operation despite use of only one clock signal.

Figure 13:
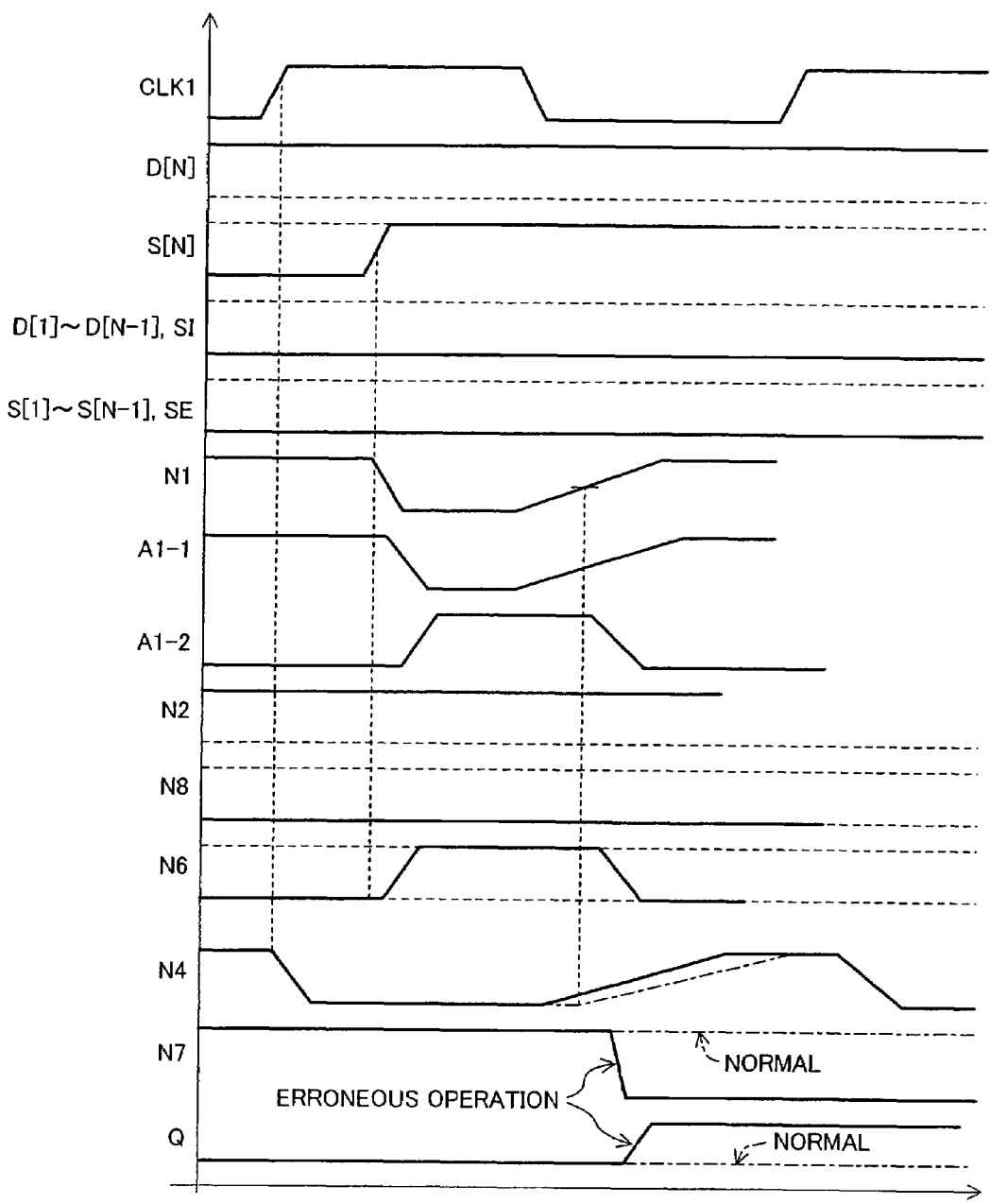
FIG. 13 is a timing chart of each node with respect to a signal input pattern in the semiconductor integrated circuit of Example 4.
Figure 14:
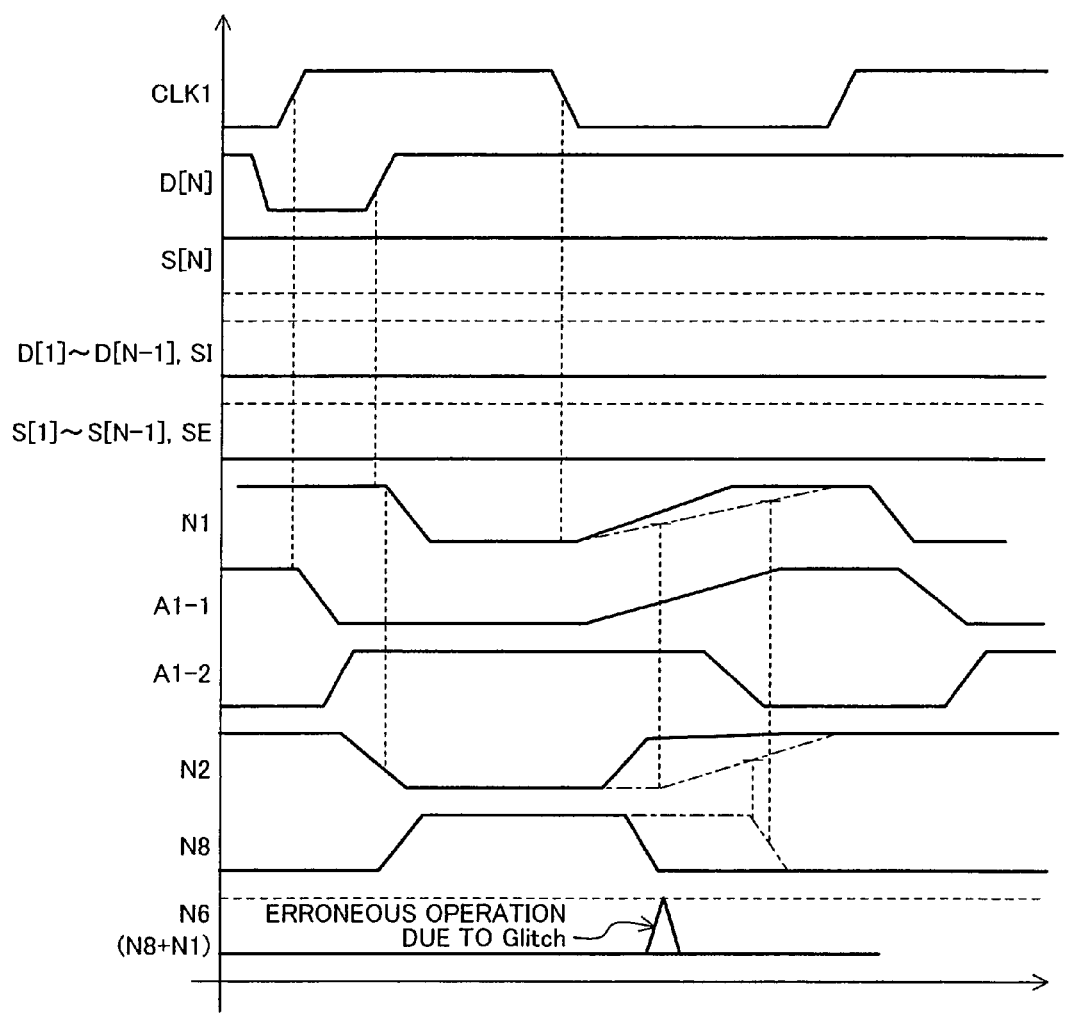
FIG. 14 is a timing chart of each node with respect to another signal input pattern in the semiconductor integrated circuit of Example 4.

FIGS. 13 and 14 illustrate a relationship between voltage and time of each node where, in the circuit of FIG. 12, a signal input pattern differs between terminals SI, D[1] to D[N-1] and a terminal D[N] or between terminals SE, S[1] to S[N-1] and a terminal S[N]. In addition, FIGS. 13 and 14 illustrate waveforms occurring in the circuits of FIGS. 1 and 9 when the transistor balance is poor and the circuit is driven with a single clock signal, resulting in an erroneous operation. Dash dot lines indicate waveforms when the circuit of FIG. 12 is used, and solid lines indicate waveforms when the circuits of FIGS. 1 and 9 are used.

A description will be provided in comparison with FIG. 12. In FIG. 13, all input signals of the terminals D[1] to D[N-1], SI, S[1] to S[N], and SE satisfy a desired setup and hold times at the timing of transition of the clock signal CLK1 to High and are Low. Only the terminal D[N] satisfies a desired setup and hold times and is High. Thereafter, during a period when the clock signal CLK1 is High, only the terminal S[N] goes from Low to High. As a result, nodes A1-1 and N1 go to Low, and a node N6 goes to High. When the p-type MOS transistor 12C has a structure similar to that of FIGS. 1 and 9, a power source voltage Vdd is supplied via the p-type MOS transistor 12C to the node N4 during subsequent transition of the clock signal CLK1 from High to Low, so that the node N4 goes to High. As a result, the High periods of the node N4 and the node N6 may overlap. When the High periods of the node N4 and the node N6 overlap, both transistors Tr21 and Tr22 are caused to be conductive, so that electric charge is discharged from a node N7. In this case, although the node N7 is supposed to be held High, the node N7 may conversely go to Low, so that an output terminal Q operates erroneously. This is particularly because measures are not particularly taken in a circuit which controls charge of the node N4 and charge of the node N1, so that the node N4 is charged earlier than the node N1, depending on variations in p-type MOS transistor devices which charge the nodes N4 and N1, leading to an erroneous operation.

In the circuit of FIG. 12, however, current-voltage characteristics of a voltage difference between the drain and source of the p-type MOS transistor 12C exhibit linearity up to near a voltage threshold voltage Vtp. Since a substrate voltage of the p-type MOS transistor 12C is higher than a source voltage thereof, the p-type MOS transistor 12C behaves as if it is a considerably high resistor. Therefore, it is likely that the node N1 is charged before the node N4 is charged. In this case, the timing of transition of the node N4 to High is delayed, so that the possibility that the nodes N4 and N6 simultaneously go to High is reduced.

A further description will be provided in comparison with FIG. 12. In FIG. 14, at the timing of transition of the clock signal CLK1 to High, the terminal S[N] satisfies a desired setup and hold times and is High, while input signals of the terminals S[1] to S[N-1], SE, D[1] to D[N], and SI satisfy a desired setup and hold times and are Low. Thereafter, during a period when the clock signal CLK1 is High, only the terminal D[N] goes from Low to High. Therefore, the node N1 goes from High to Low. When the p-type MOS transistor 12B has a structure similar to that of FIGS. 1 and 9, the nodes N1 and N2 are charged during subsequent transition of the clock signal CLK1 from High to Low. In this case, if the node N1 is charged later than the node N2, the node N2 goes to High while the node N1 goes to Low, so that the node N6 goes to High, resulting in a glitch in the node N7. If the glitch is propagated to the output terminal Q, an erroneous operation may occur.

In the circuit of FIG. 12, however, current-voltage characteristics of a voltage difference between the drain and source of the p-type MOS transistor 12B exhibit linearity up to near a voltage threshold voltage Vtp. Since a substrate voltage of the p-type MOS transistor 12B is higher than a source voltage thereof, the p-type MOS transistor 12B behaves as if it is a considerably high resistor. Therefore, the node N2 goes to High only after the node N1 goes to High. Therefore, the node N6 does not go to High, thereby preventing an erroneous operation.

As described above, when the source and drain of the p-type MOS transistor 12B are connected to the nodes N1 and N2, respectively, and the source and drain of the p-type MOS transistor 12C are connected to the nodes N1 and N4, respectively, the charging order of the nodes N1 and N2 and the charging order of the nodes N1 and N4 are uniquely determined without depending on manufacturing variations in device size of the p-type MOS transistor, thereby making it possible to obtain a more robust circuit structure.

The circuit of FIG. 12 is further characterized in that, in a dynamic circuit A1, the gates of MOS transistors AN and A3 to AN-1, which are connected directly to the power source and the ground in FIG. 9, are connected to two outputs of a circuit 12A. In a miniaturization process, a thickness of a gate oxide film becomes thin, so that the ESD robustness of the gate is reduced. Therefore, in the circuit of FIG. 9, when an overvoltage is applied to the power source or the ground, the low impedance is highly likely to cause punchthrough in the gate electrode, likely leading to destruction of the MOS transistor. However, by providing the circuit 12A as illustrated in FIG. 12, the gate of the MOS transistor is connected via a resistance between the source and the drain to the power source and the ground. Therefore, there is a high impedance between the gate and the power source or the ground, whereby the MOS transistor is unlikely to be destroyed.

It is also preferable that the circuit 12A is provided as a part of the multi-input flip-flop in the same standard cell in which the output of the circuit 12A is input to the gates of a second group of n-type transistors A3 to AN which in turn operate. This is because such a multi-input flip-flop has a number of input terminals, so that wiring between standard cells is complicated. Unless the circuit 12A is provided in the cell, a cell, such as the circuit 12A, needs to be provided elsewhere, and the cell and the multi-input flip-flop need to be connected via wiring, so that the degree of wiring congestion between standard cells is increased. Wiring between standard cells is typically automatically installed. Therefore, wiring may be accidentally arranged such that an output of the circuit 12A is influenced with a crosstalk. When the output of the circuit 12A is contaminated with crosstalk noise, the flip-flop circuit having a multi-input selection function may perform an erroneous operation. Therefore, in consideration of an influence of the crosstalk, it is preferable that the circuit 12A is provided in the standard cell as long as it is permitted.

In the circuit 12A, the drain of a p-type MOS transistor 12A-2 is assumed to be a node which is connected to the gate of an n-type MOS transistor 12A-1 for the purpose of reduction of the number of devices. Alternatively, similar to the structure of the MOS transistors 12A-2 and 12A-3, another p-type MOS transistor is provided, and the drain and gate of the p-type MOS transistor are connected in common to the gate of the n-type MOS transistor 12A-1.

When the circuit 12A is provided further below the right and left n-type MOS transistors in a lower portion of FIG. 10, the circuit 12A can be connected to the following stage without long wiring of a circuit A1 and the node N1 of FIG. 12. If the circuit of FIG. 12 is a standard cell, NWELL and PWELL are provided at a lower end thereof again. Therefore, cells can be arranged without considering a distance constraint of an interface between different wells at an interface between lower cells.

EXAMPLE 5

Figure 15:
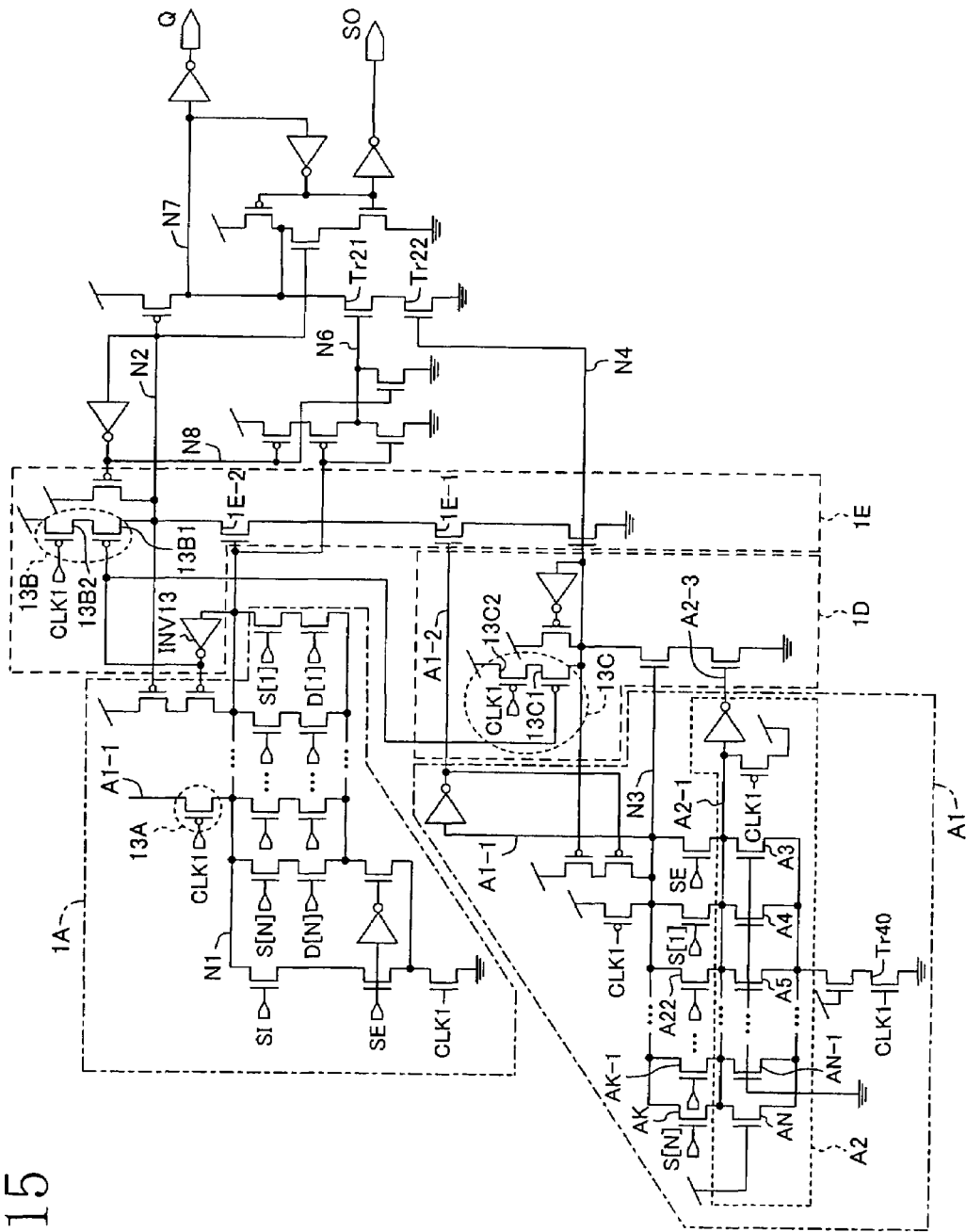
FIG. 15 is a diagram illustrating a structure of a semiconductor integrated circuit according to Example 5 of the present invention.

FIG. 15 is a circuit diagram illustrating another multi-input flip-flop according to the present invention.

The multi-input flip-flop of FIG. 15 is different from those of FIGS. 1 and 9 in the flip-flop of FIG. 15 is operated with a single clock signal CLK1, and further, in circuit portions 13B, 13C and 13A of the flip-flop of FIG. 15. In FIG. 1, p-type MOS transistors (transistors Tr4, Tr12 in FIG. 1) are provided whose sources are connected to a power source and which are used to charge the dynamic node portions N2 and N4. In the circuit of FIG. 15, further, other p-type MOS transistors (p-type MOS transistor 13B1, p-type MOS transistor 13C1) are connected to the drain of a p-type MOS transistor for charging, and are connected via the source and drain to nodes N2 and N4, respectively. The gate of the p-type MOS transistor 13B1 and the gate of the p-type MOS transistor 13C1 are connected to an output of an inverter circuit INV13 of the node N1. Further, although the source of the p-type MOS transistor 13A is connected to the power source in FIG. 11, it is connected to a node A1-1 of FIG. 15. Thus, this circuit employs only one clock signal, thereby making it possible to reduce power consumption, and avoid an erroneous operation despite use of only one clock signal.

Figure 16:
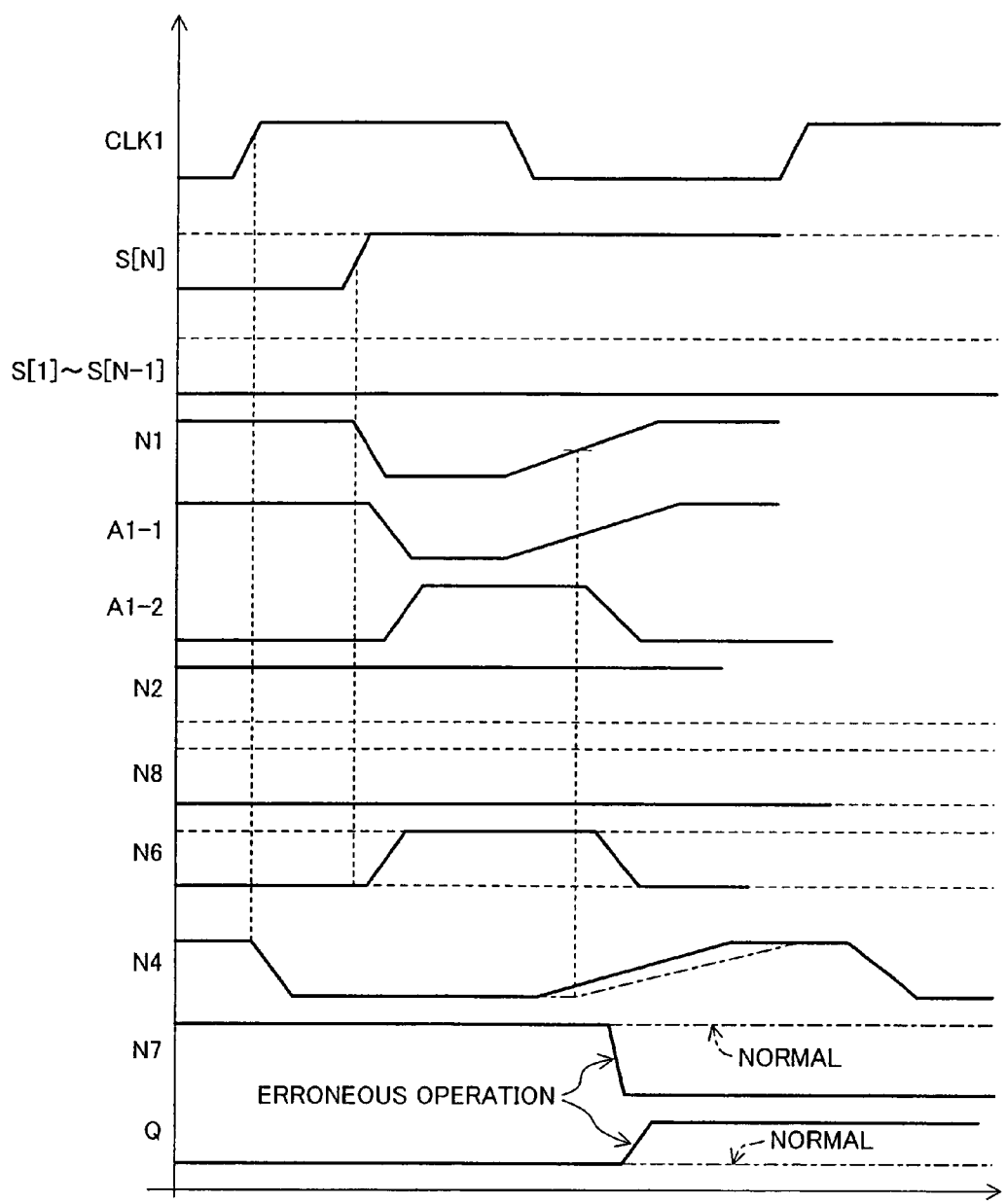
FIG. 16 is a timing chart of each node with respect to a signal input pattern in the semiconductor integrated circuit of Example 5.
Figure 17:
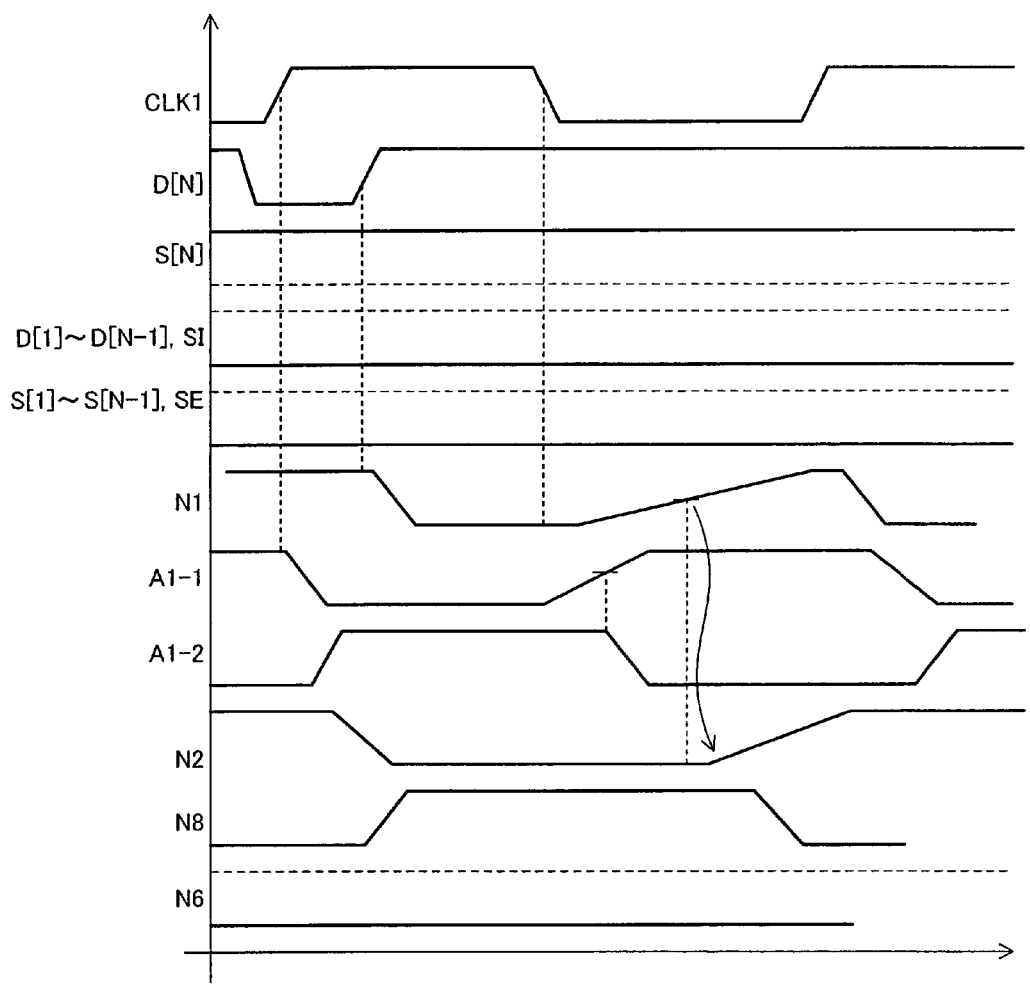
FIG. 17 is a timing chart of each node with respect to another signal input pattern in the semiconductor integrated circuit of Example 5.

FIGS. 16 and 17 illustrate a relationship between voltage and time of each node where, in the circuit of FIG. 15, a signal input pattern differs between terminals D[1] to D[N-1] and a terminal D[N] and between terminals S[1] to S[N-1] and a terminal S[N]. In addition, FIGS. 16 and 17 illustrate waveforms occurring in the circuits of FIG. 9 when the transistor balance is poor and the circuit is driven with a single clock signal, resulting in an erroneous operation. Dash dot lines indicate waveforms when the circuit of FIG. 15 is used, and solid lines indicate waveforms when the circuit of FIG. 9 is used.

A description will be provided in comparison with FIG. 15. In FIG. 16, all input signals of the terminals S[1] to S[N] satisfy a desired setup and hold times at the timing of transition of the clock signal CLK1 to High and are Low. Thereafter, during a period when the clock signal CLK1 is High, only the terminal S[N] goes from Low to High. As a result, nodes A1-1 and N1 go to Low, and a node N6 goes to High. When the circuit 13C has a structure similar to that of FIGS. 1 and 9, a power source voltage Vdd is supplied via two p-type MOS transistors 13C1 and 13C2 to the node N4 during subsequent transition of the clock signal CLK1 from High to Low, so that the node N4 goes to High. As a result, the High periods of the node N4 and the node N6 may overlap. When the High periods of the node N4 and the node N6 overlap, both transistors Tr21 and Tr22 are made conductive, so that electric charge is discharged from a node N7. In this case, although the node N7 is supposed to be held High, the node N7 may conversely go to Low, so that an output terminal Q operates erroneously. This is because measures are not particularly taken in a circuit which controls charge of the node N4 and charge of the node N1, so that the node N4 is charged earlier than the node N1, depending on variations in p-type MOS transistor devices which charge the nodes N4 and N1, leading to an erroneous operation.

In the circuit of FIG. 15, however, the circuit 13C is not turned ON unless a potential of an output of the inverter circuit INV13 of the node N1 is smaller than or equal to a difference between a threshold voltage of a p-type MOS transistor in the circuit 13C and a power source voltage Vdd. Therefore, it is likely that the node N1 is charged earlier and the node N4 is charged later. Therefore, the possibility that the nodes N4 and N6 are simultaneously High is reduced.

A further description will be provided in comparison with FIG. 15. In FIG. 17, at the timing of transition of the clock signal CLK1 to High, the terminal S[N] satisfies a desired setup and hold times and is High, while input signals of the terminals S[1] to S[N-1], SE, D[1] to D[N], and SI satisfy a desired setup and hold times and are Low. Thereafter, during a period when the clock signal CLK1 is High, only the terminal D[N] goes from Low to High. Therefore, the node N1 goes from High to Low. Thereafter, in the circuit of FIG. 1, the nodes N1 and N2 are charged during subsequent transition of the clock signal CLK1 from High to Low. In this case, if the node N1 is charged later than the node N2, the node N2 goes to High while the node N1 goes to Low, so that the node N6 goes to High, resulting in a glitch in the node N7. If the glitch is propagated to the output terminal Q, an erroneous operation may occur.

In the circuit of FIG. 15, however, the node N2 is not charged unless a potential of an output of the inverter circuit INV13 of the node N1 is smaller than or equal to a difference between a threshold voltage of a p-type MOS transistor 13B1 in the circuit 13B and the power source voltage Vdd. Therefore, the node N2 goes to High only after the node N1 goes to High. Therefore, the node N6 does not go to High, thereby preventing an erroneous operation.

Figure 18:
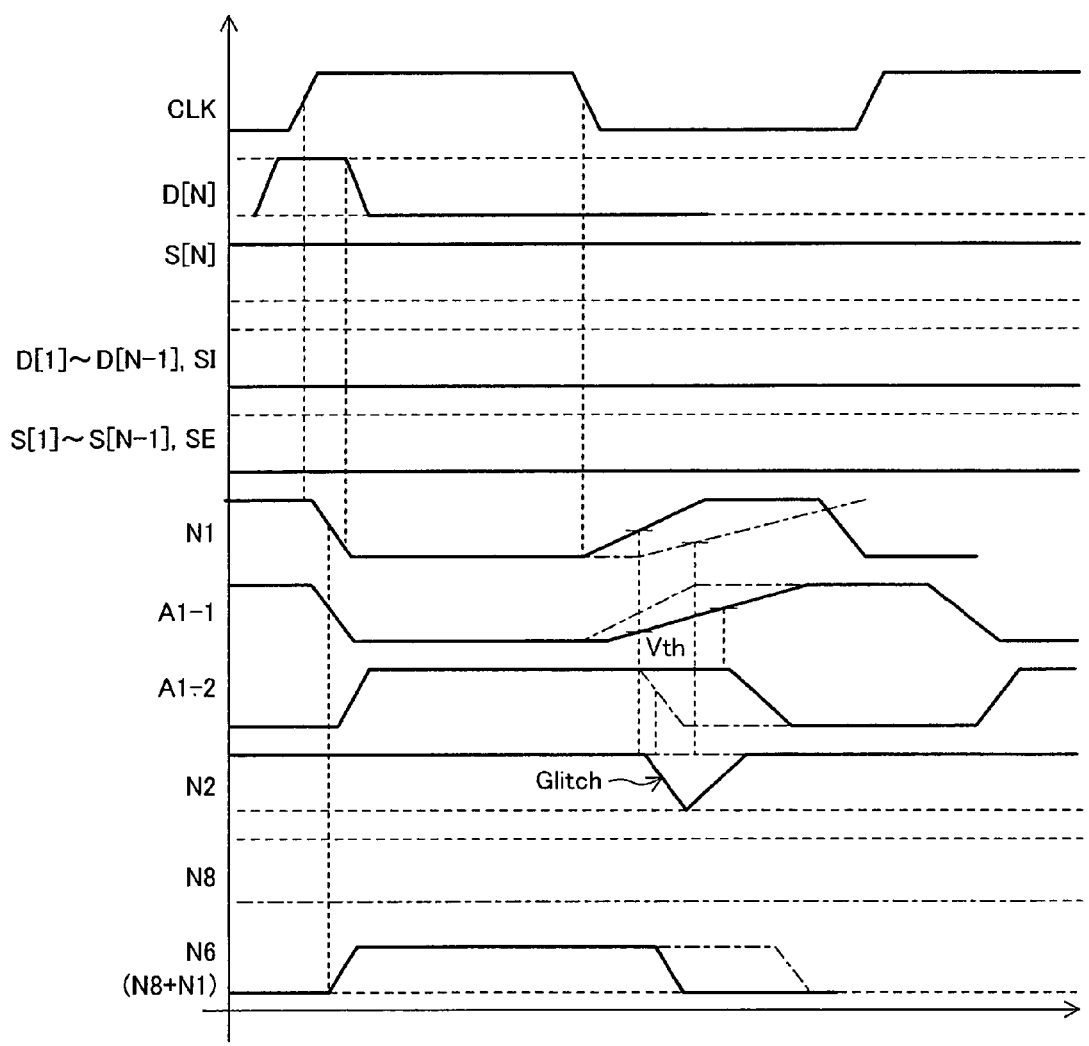
FIG. 18 is a timing chart of each node with respect to still another signal input pattern in the semiconductor integrated circuit of Example 5.

Further, in FIG. 18, when the clock signal CLK1 goes to High, the terminals D[N] and S[N] satisfy a desired setup and hold times and are High, while input signals of the terminals S[1] to S[N-1], SE, D[1] to D[N-1], and SI satisfy a desired setup and hold times and are Low. Thereafter, during a period when the clock signal CLK1 is High, the terminal D[N] goes from High to Low. Thereafter, the clock signal CLK1 goes from High to Low. In this case, the node A1-1 and the node N1 are charged. The node N1 reaches a threshold voltage Vtn of the n-type MOS transistor earlier than the node A1-1, depending on transistor variations in the p-type MOS transistor. In this case, a through current flows through the node N25, resulting in a glitch in the node N2. The glitch is propagated to the node N7, so that an erroneous operation occurs in the output terminal Q.

In the circuit of FIG. 15, however, since the source of the p-type MOS transistor 13A is connected to the node A1-1, current-voltage characteristics of a voltage difference between the drain and source of the p-type MOS transistor 13A exhibit linearity up to near a voltage threshold voltage Vtp. Since a substrate voltage of the p-type MOS transistor 13A is higher than a source voltage thereof, the p-type MOS transistor 13A behaves as if it is a considerably high resistor. Therefore, the node A1-$i$ is charged first before start of charging of the node N1. Therefore, after a gate voltage of an n-type MOS transistor 1E-1 becomes smaller than or equal to a threshold voltage of the n-type MOS transistor, a gate voltage of an n-type MOS transistor 1E-2 becomes easier to be larger than or equal to a threshold voltage, so that the through current of the node N2 becomes difficult to flow, and therefore, a glitch does not occur in the node. N7. Further, in FIG. 15, the gate of a p-type MOS transistor 13B2 and the gate of a p-type MOS transistor 13C2 are connected to the clock signal CLK1. Therefore, in FIG. 15, when the clock signal CLK1 has a voltage of (Vdd−Vtp) or more, the node N2 is ready for discharging. Therefore, the node N2 can operate faster than that of FIG. 12. This is an advantage over the circuit of FIG. 12, in which discharging of the node N2 starts only after a voltage of a node A1-2 reaches (Vdd−Vtp) or more.

As described above, the source of the p-type MOS transistor 13B2 is connected to the power source. The drain of the p-type MOS transistor 13B2 is connected to the source of the first p-type MOS transistor 13B1. The drain of the p-type MOS transistor 13B1 is connected to the node N2. The gate of the second p-type MOS transistor 131B2 is connected to the clock signal CLK1. The gate of the p-type MOS transistor 13B1 is connected to the output of the inverter circuit INV13 of the node N1. The source of the p-type MOS transistor 13C1 is connected to the power source. The drain of the p-type MOS transistor 13C1 is connected to the source of the p-type MOS transistor 13C1. The drain of the p-type MOS transistor 13C2 is connected to the node N4. The gate of the p-type MOS transistor 13C2 is connected to the clock signal CLK1. The gate of the p-type MOS transistor 13C1 is connected to the output of the inverter circuit INV13 of the node N1. The source of the p-type MOS transistor 13A is connected to the node A1-1. As a result, the charging order of the node A1-1 and the node N1, the charging order of the node N1 and the node N2, and the charging order of the node N1 and the node N4 are each uniquely determined without depending on manufacturing variations in device size of the p-type MOS transistor, thereby making it possible to obtain a more robust circuit structure.

The structure in which the source of the p-type MOS transistor 13A is connected to the node A1-1 is described above. Alternatively, the source of the p-type MOS transistor 13A may be connected to the drain of another p-type MOS transistor, whose source may be in turn connected to the power source and whose gate may be in turn connected to the output of the inverter circuit of the node A1-1. In this case, a similar effect can be obtained. In other words, the present invention may be implemented with any circuit structure in which the charging order of the node A1-1 and the node N1, the charging order of the node N1 and the node N2, and the charging order of the node N1 and the node N4 can each be uniquely determined without depending on manufacturing variations in device size of the p-type MOS transistor. Such a circuit structure can be achieved with a combination of various circuits, and does not depart from the scope of the present invention.

EXAMPLE 6

Figure 19:
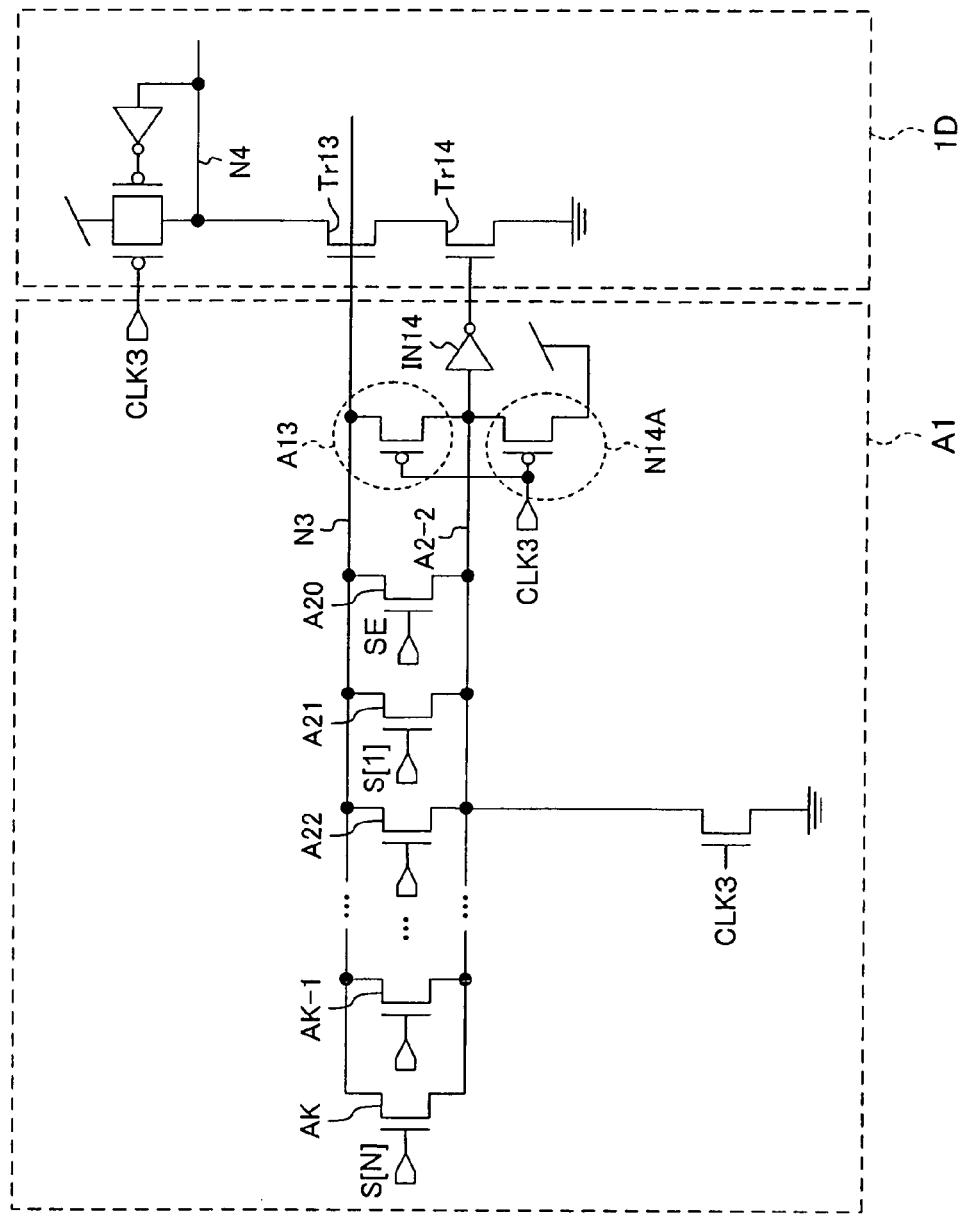
FIG. 19 is a diagram illustrating a structure of a semiconductor integrated circuit according to Example 6 of the present invention.

FIG. 19 is another circuit diagram illustrating dynamic circuits 1C and 1D of the multi-input flip-flop of FIG. 1.

The dynamic circuits 1C and 1D of FIG. 19 are different from those of FIG. 1 in that the source and drain of a p-type MOS transistor A13 are connected to a node N3 and a node A2-2, respectively, in place of the p-type MOS transistor Tr9 for charging the node N3. In addition, although the clock signal CLK4 is connected to the gate terminal of the transistor Tr14 of the dynamic circuit 1D in FIG. 1, an output of an inverter circuit IN14 is connected to the gate terminal of a transistor Tr14 in FIG. 19.

Such a circuit structure has an advantage such that when a signal having the same phase as that of a clock signal CLK3 is input to a clock signal CLK4, i.e., the circuit is driven only based on the clock signal CLK3 as in FIG. 19, the circuit can operate with an even lower power source voltage. The reason will be described as follows. In the circuit structure of FIG. 1, it is assumed that the clock signal CLK4 and the clock signal CLK3 having the same phase are input. When the clock signal CLK3 goes from Low to High with a low power source voltage which is in the vicinity of a threshold voltage of the n-type MOS transistor (e.g., the threshold voltage of the n-type MOS transistor is 0.3 V and the power source voltage is 0.5 V), it takes an overwhelmingly longer time for the node N3 to discharge than for the gate terminal of the transistor Tr14. In this case, the node N4 goes to High, but not Low, though the transistor Tr13 is supposed to be cut off and the node N4 is supposed to go to High (i.e., any of the terminals S[1] to S[N] and the terminal SE goes to High).

In the structure of FIG. 19, however, when the clock signal CLK3 goes from Low to High, the nodes N3 and A2-2 simultaneously start discharging. When the node N14A goes to no more than a switching level of the inverter circuit IN14, the voltage of the gate of the transistor Tr14 is increased. Therefore, the node N3 goes to no more than the threshold voltage of the n-type MOS transistor Tr13 before the gate of the transistor Tr14 goes to High. In this case, it is unlikely that a through current flows through the node N4 via the transistors Tr13 and Tr14. As a result, a low-voltage operation which is stabler than that of the circuit structure of FIG. 1 is obtained.

Further, when the clock signal CLK3 goes from High to Low, current-voltage characteristics of a voltage difference between the drain and source of the p-type MOS transistor A13 exhibit linearity up to near a voltage threshold voltage Vtp. Since a substrate voltage of the p-type MOS transistor A13 is higher than a source voltage thereof, the p-type MOS transistor A13 behaves as if it is a considerably high resistor. The node N3 is charged only after the potential of the node A2-2 becomes higher than or equal to the threshold voltage of the p-type MOS transistor A13. In other word, the transistor Tr13 is turned ON only after the gate of the transistor Tr14 is lowered to some extent. Since the node N4 is charged in accordance with the clock signal CLK3, a glitch is suppressed from occurring in the potential of the node N4 when the transistor Tr13 is turned ON. As a result, an erroneous operation which is involved with the dynamic the circuits A1 and 1D is suppressed.

EXAMPLE 7

Figure 11:
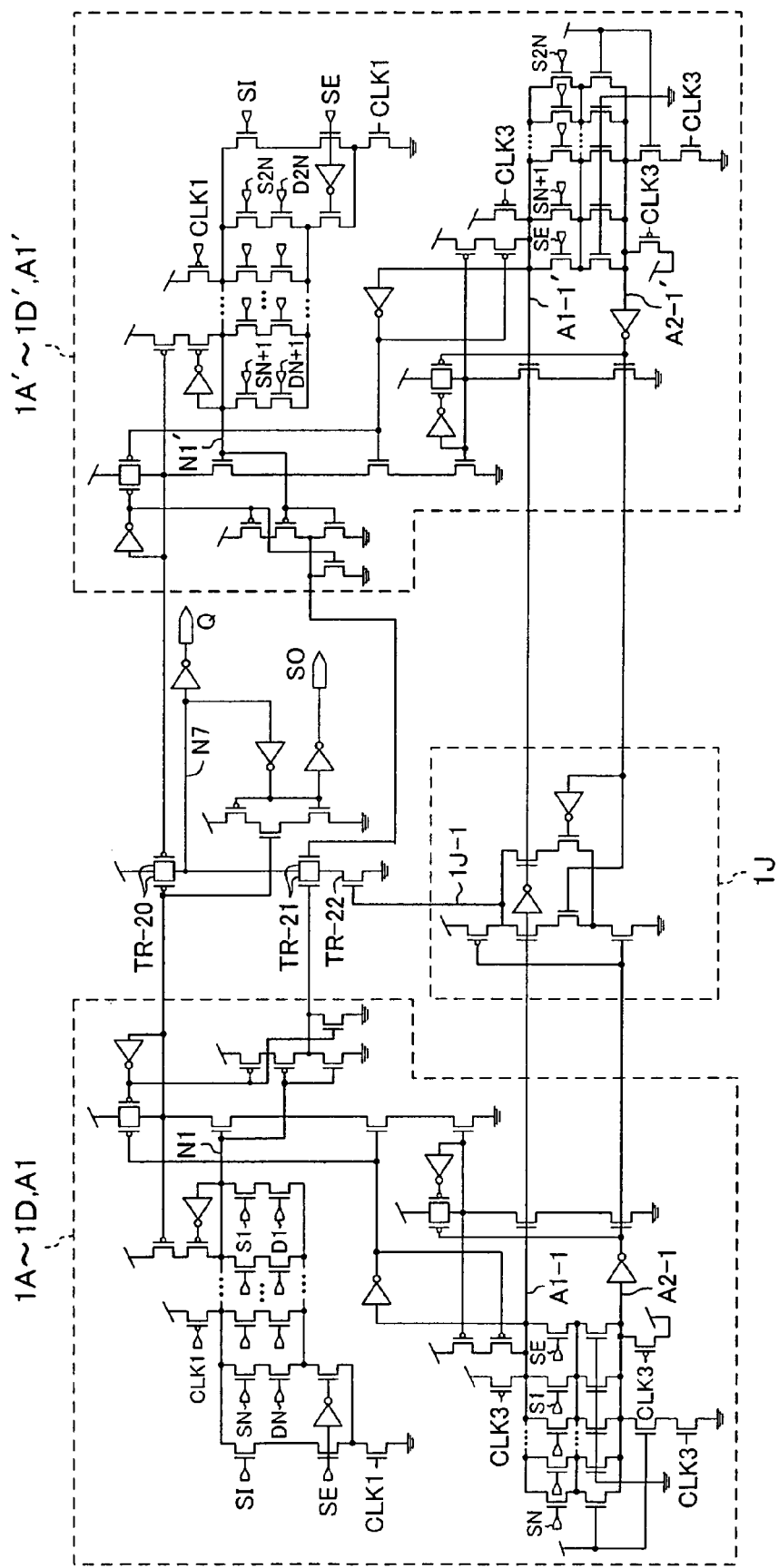
FIG. 11 is a diagram illustrating another variation of the semiconductor integrated circuit of FIG. 9.
Figure 20:
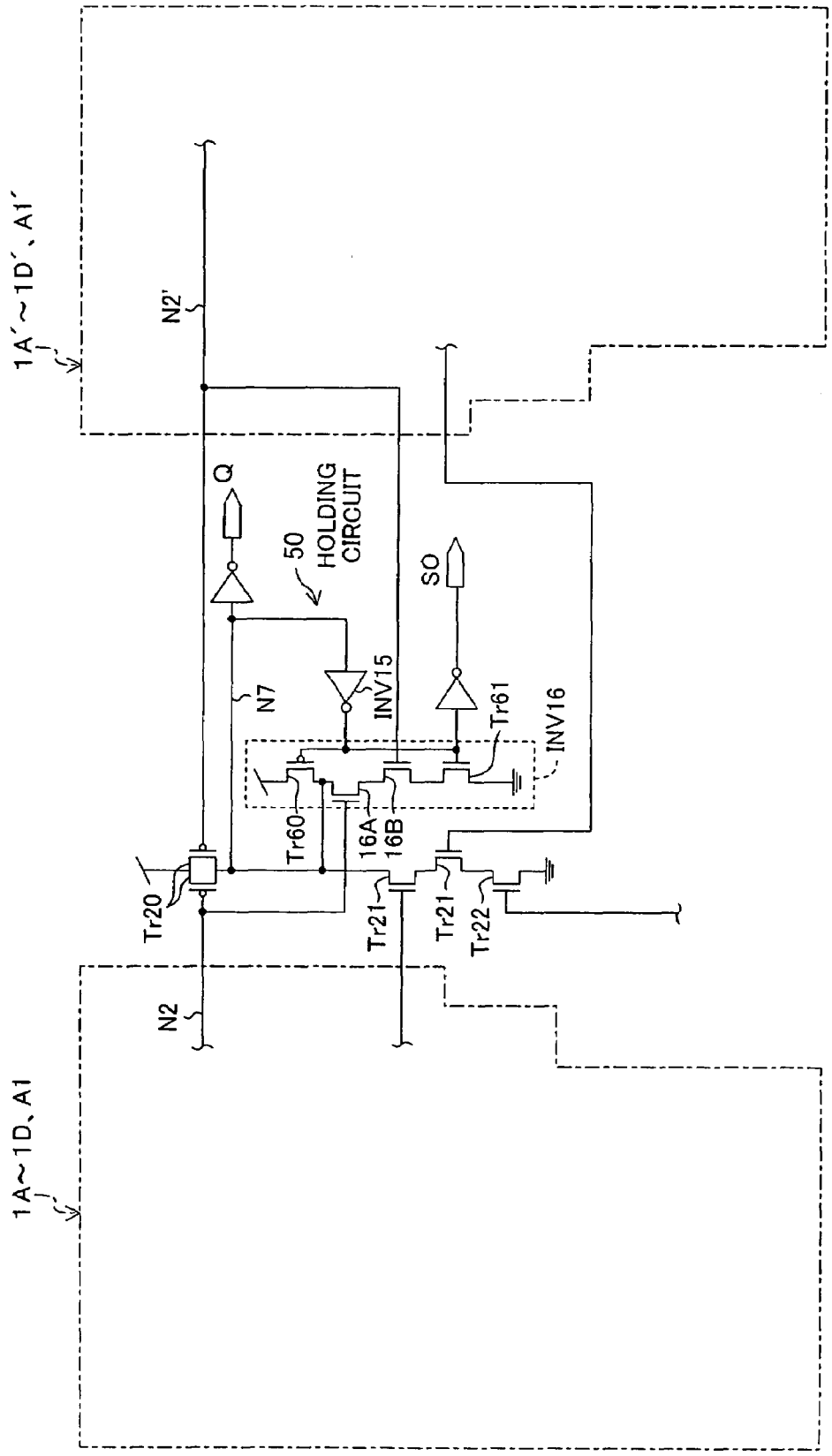
FIG. 20 is a diagram illustrating a structure of a semiconductor integrated circuit according to Example 7 of the present invention.

FIG. 20 illustrates an exemplary application of FIG. 11.

In FIG. 11, a flip-flop is provided which has a multi-input selection function in which input data is divided into two groups. In FIG. 20, transistors of the output circuits 1E are combined to construct a NAND logic circuit with respect to outputs of a multi-input selection function composed of dynamic circuits 1A to 1D, and A1 and a multi-input selection function composed of dynamic circuits 1A' to 1D', and A1'.

Specifically, two p-type MOS transistors Tr20 which have a common source and drain are provided. The p-type MOS transistor pair Tr21 is connected in series to each other. Further, in FIG. 11, a holding circuit portion is provided which is composed of an inverter connected to the drain of the p-type MOS transistor Tr20 and another inverter which receives an output of the inverter. In the holding circuit portion, one stage of n-type MOS transistor to the gate of which the second output nodes N2 of the dynamic circuits 1A to 1D and A1 are connected is provided between an N-type MOS transistor and a p-type MOS transistor constituting one of the inverters. In FIG. 20, one stage of n-type MOS transistor 16A to the gate of which the second output nodes N2 of the dynamic circuits 1A' to 1D' and A1' are connected is provided, thereby maintaining the high speed of the holding circuit portion. Note that the two stages of n-type MOS transistors may be provided between the ground and the n-type MOS transistor constituting the inverter.

In this example, an exemplary NAND logic has been described. The present invention is not limited to this. Various combined logic circuits can be produced. In addition, by replacing a dynamic logic portion involved in the dynamic circuit 1A or 1A' with various logics, a flip-flop circuit having more various combined logic functions can be constructed. Further, a signal selected from a plurality of input signals may be divided into a plurality of signals, each of which may be input to a NAND circuit, a NOR circuit, an EXOR circuit, or the like. Thereby, the single selected signal may be subjected to different logical operations so that a plurality of signals thus logically operated are output. Furthermore, a MOS transistor may be added to the transistor Tr20 or the transistor Tr21, and the gate terminal thereof may be connected to an output of another multi-input dynamic circuit. The resultant circuit does not depart from the scope of the present invention.

Figure 21:
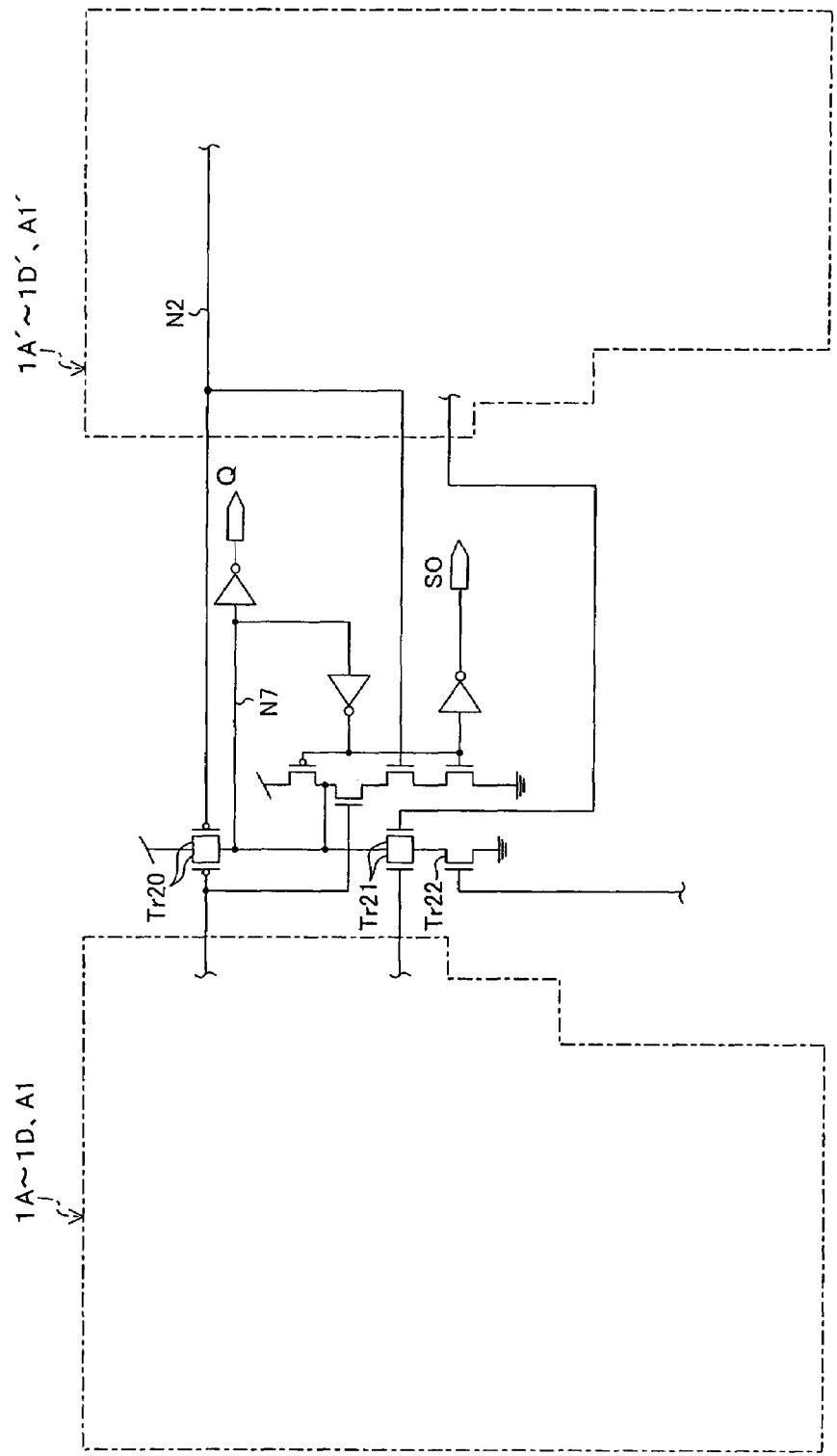
FIG. 21 is a diagram illustrating a structure of a variation of a semiconductor integrated circuit according to Example 7 of the present invention.

FIG. 21 illustrates another exemplary application of FIG. 11, in which the source and drain of a transistor Tr21 in each output circuit are connected in common.

EXAMPLE 8

Figure 22:
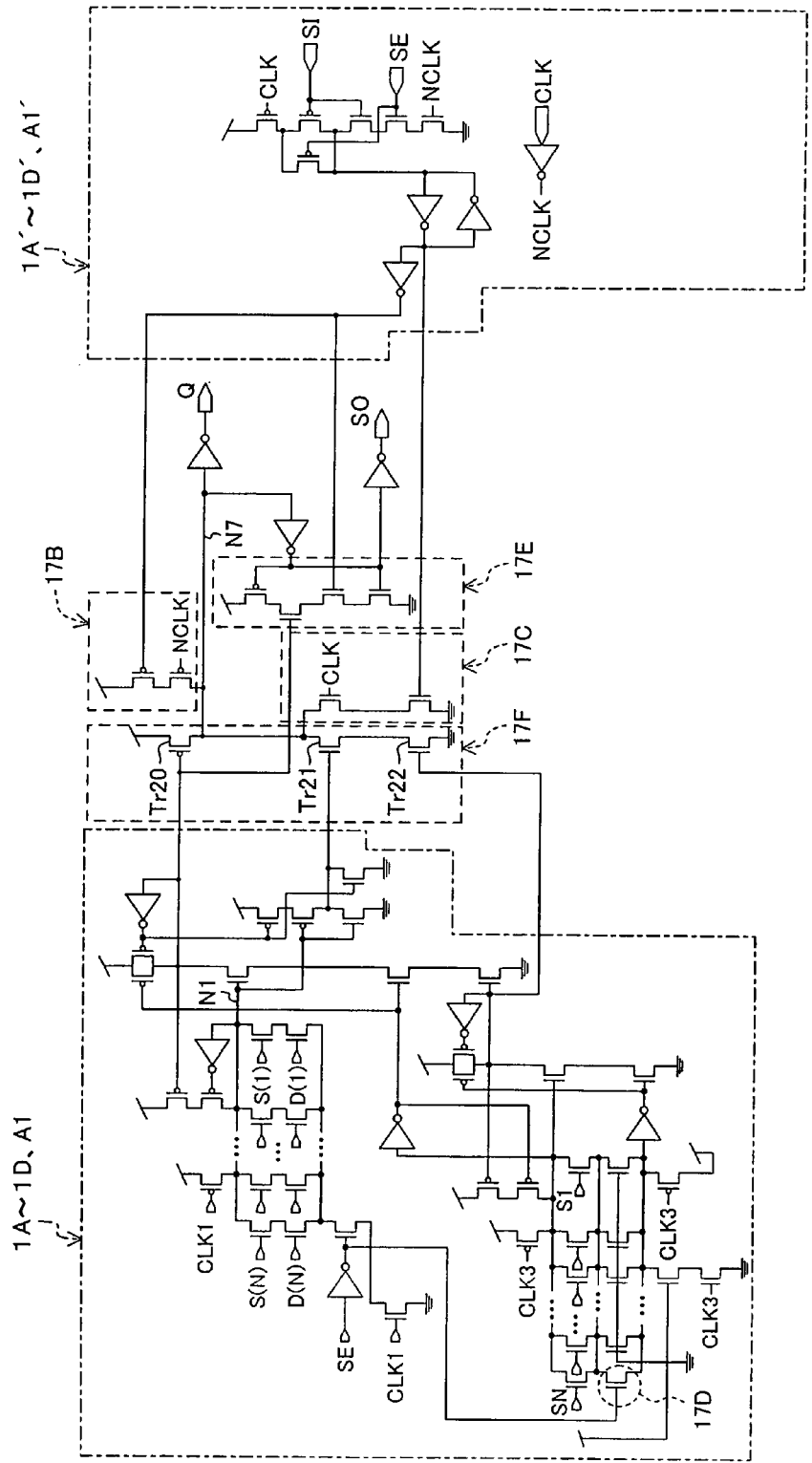
FIG. 22 is a diagram illustrating a structure of a semiconductor integrated circuit according to Example 8 of the present invention.

FIG. 22 illustrates another exemplary application of FIG. 11, in which only a scan input circuit is provided in dynamic circuits 1A' to 1D' and A1'.

The dynamic circuits 1A' to 1D', A1', 17B and 17C are static flip-flops which share a holding circuit portion 17E and an output portion of an output terminal Q with a multi-input selection function flip-flop composed of dynamic circuits 1A to 1D and A1. Further, the circuit of FIG. 22 is different from that of FIG. 11 in that the gate of an n-type MOS transistor 17D is connected to an inverted output of a scan enable signal SE.

With this circuit structure, when the scan enable signal is activated, transistors Tr22 and Tr20 are cut off, while only the circuit elements 17B and 17C are operated. The circuit has an advantage such that the capacitance of a node N1 can be reduced, and in an ordinary path, high speed can be achieved by using a dynamic flip-flop. For a scan path, a hold time during scan input is shortened by using a static flip-flop, thereby effectively securing a margin for a scan shift operation.

Note that by combining an output circuit portion of the dynamic circuit and an output portion of the static circuit with an output circuit portion 17F, a flip-flop circuit having more various logic functions can be obtained. As described above, in the present invention, the advantages of the dynamic circuit and the static circuit can be selectively utilized, depending on the function of an input signal or a desired specification.

The eight embodiments have been heretofore described. It is easy for those skilled in the art to exchange a portion of the circuit structure of a semiconductor integrated circuit of any one of the eight embodiments with a portion of the circuit structure of any one of the other embodiments. For example, the dynamic circuit 1B of FIG. 8 may be exchanged with the dynamic circuit 1B of FIG. 9.

What is claimed is:

1. A semiconductor integrated circuit which receives a clock, a plurality of pieces of data, and a plurality of selection signal for selecting the data, and when the clock is transitioned, outputs a selected one of the pieces of data selected by the selection signal to a holding circuit, the semiconductor integrated circuit comprising:

a non-selected state detection circuit of detecting that all of the plurality of selection signals selects none of the plurality of pieces of data, wherein, in the non-selected state detection circuit, when it is detected that all of the plurality of selection signals selects none of the plurality of pieces of data, the previously selected data is prevented from being changed, thereby holding output data of the holding circuit.

* * * * *